(12) United States Patent
Matsumura et al.

(10) Patent No.: US 12,402,423 B2
(45) Date of Patent: Aug. 26, 2025

(54) DETECTION DEVICE

(71) Applicant: Magnolia White Corporation, Tokyo (JP)

(72) Inventors: Kazune Matsumura, Tokyo (JP); Yasushi Nakano, Tokyo (JP)

(73) Assignee: Magnolia White Corporation, Tokyo (JP)

( * ) Notice: Subject to any disclaimer, the term of this patent is extended or adjusted under 35 U.S.C. 154(b) by 352 days.

(21) Appl. No.: 18/065,273

(22) Filed: Dec. 13, 2022

(65) Prior Publication Data

US 2023/0110093 A1    Apr. 13, 2023

Related U.S. Application Data

(63) Continuation of application No. PCT/JP2021/021372, filed on Jun. 4, 2021.

(30) Foreign Application Priority Data

Jun. 22, 2020   (JP) ................................ 2020-107100

(51) Int. Cl.
*H10F 39/12*     (2025.01)
*H10F 39/00*     (2025.01)
*G06V 40/13*     (2022.01)

(52) U.S. Cl.
CPC ......... *H10F 39/198* (2025.01); *H10F 39/805* (2025.01); *H10F 39/811* (2025.01); *G06V 40/1318* (2022.01)

(58) Field of Classification Search
CPC .................................................... G06V 40/13
See application file for complete search history.

(56) References Cited

U.S. PATENT DOCUMENTS

| | | | |
|---|---|---|---|
| 11,099,438 | B2 | 8/2021 | Shiina |
| 11,467,453 | B2 | 10/2022 | Shiina |
| 2010/0302134 | A1 | 12/2010 | Hasegawa |
| 2011/0109605 | A1 | 5/2011 | Omori et al. |
| 2015/0179717 | A1 | 6/2015 | Kawata |
| 2018/0341143 | A1 | 11/2018 | Hyodo et al. |

FOREIGN PATENT DOCUMENTS

| | | |
|---|---|---|
| JP | 2010-277378 A | 12/2010 |
| JP | 2011-107761 A | 6/2011 |
| JP | 2015-143846 A | 8/2015 |
| JP | 2018-200377 A | 12/2018 |
| JP | 2019-191460 A | 10/2019 |

OTHER PUBLICATIONS

International Search Report issued in International Patent Application No. PCT/JP2021/021372 mailed on Aug. 24, 2021 and English translation of same. 5 pages.
Written Opinion issued in International Patent Application No. PCT/JP2021/021372 mailed on Aug. 24, 2021. 4 pages.
Office Action issued in related Japanese Patent Application No. 2020-107100, mailed on Apr. 23, 2024 and English translation of same. 5 pages.

*Primary Examiner* — Suberr L Chi
(74) *Attorney, Agent, or Firm* — K&L Gates LLP

(57) ABSTRACT

A detection device includes a substrate, a plurality of photodiodes that are arranged in a detection region of the substrate, a plurality of first terminals that are arranged in a first direction in a peripheral region outside the detection region of the substrate, an insulating film that covers the first terminals, and an anisotropic conductive film that is located above the insulating film, and covers the first terminals.

14 Claims, 25 Drawing Sheets

FIG.6
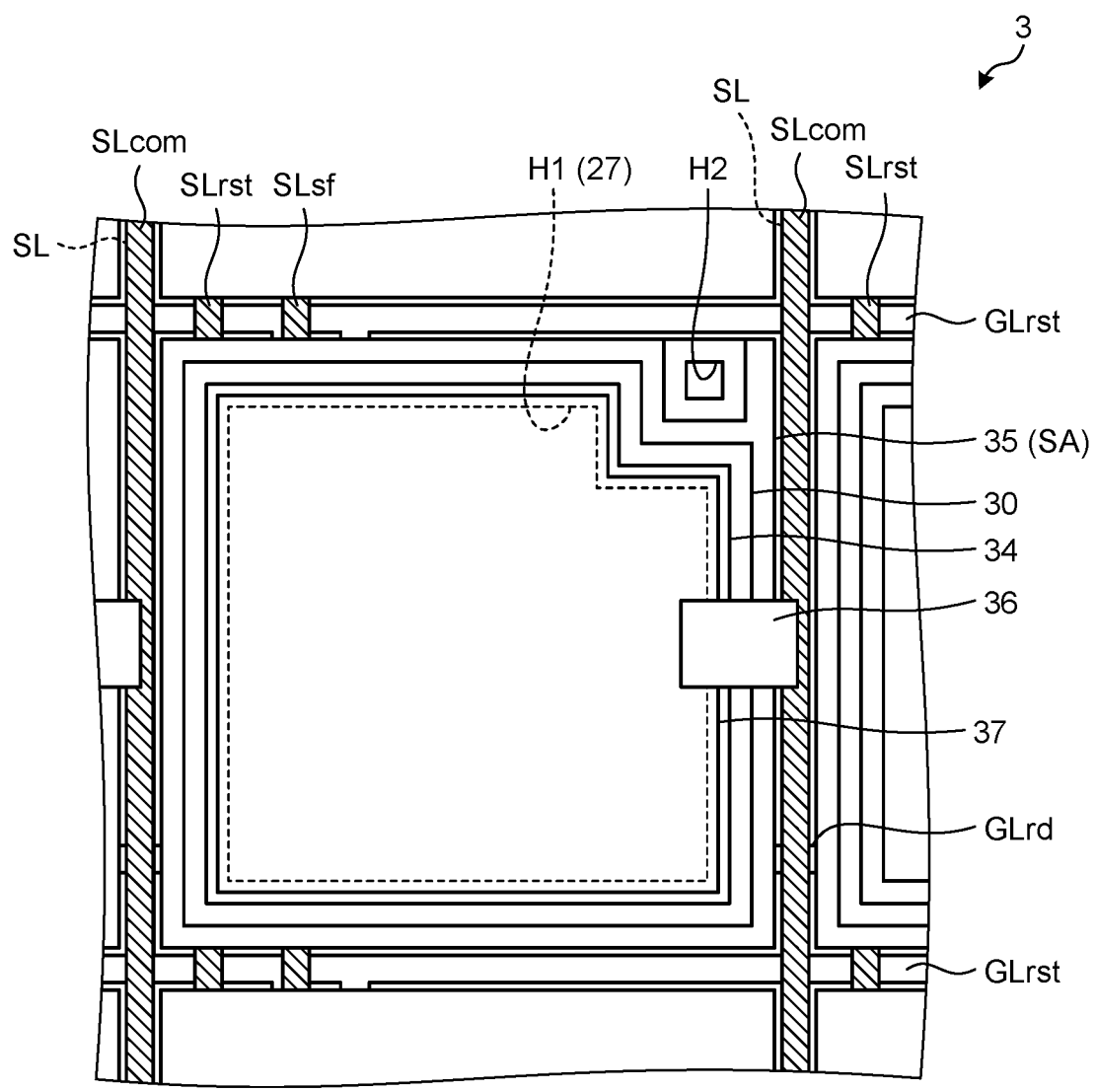
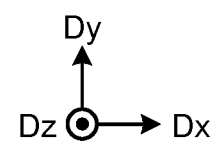

DETECTION DEVICE

CROSS-REFERENCE TO RELATED APPLICATION

This application is a continuation of International Patent Application No. PCT/JP2021/021372 filed on Jun. 4, 2021 which designates the United States, incorporated herein by reference, and which claims the benefit of priority from Japanese Patent Application No. 2020-107100 filed on Jun. 22, 2020, incorporated herein by reference.

BACKGROUND

1. Technical Field

The present invention relates to an electronic apparatus, and in particular, to a detection device.

2. Description of the Related Art

A liquid crystal display device of Japanese Patent Application Laid-open Publication No. 2010-277378 A includes a plurality of optical sensors. The optical sensors each include a photodiode. The photodiode converts light emitted thereto into a signal (electric charge). The optical sensors are generally arranged in a matrix having a row-column configuration. The optical sensors arranged in a matrix having a row-column configuration are used in detection devices, for example, as biometric sensors, such as fingerprint sensors and vein sensors, that detect biometric information. A substrate of the optical sensors is provided there on with a plurality of terminals for electrically coupling to external circuitry. The terminals are coupled to a wiring substrate, such as a flexible printed circuit board, and integrated circuits (ICs).

The optical sensors including a plurality of photodiodes are required to be improved in coupling reliability of the terminals.

SUMMARY

A detection device according to an embodiment of the present disclosure includes a substrate, a plurality of photodiodes that are arranged in a detection region of the substrate, a plurality of first terminals that are arranged in a first direction in a peripheral region outside the detection region of the substrate, an insulating film that covers the first terminals, and an anisotropic conductive film that is located above the insulating film, and covers the first terminals. Each of the first terminals comprises, between the substrate and the insulating film, a first metal layer, a second metal layer that is stacked above the first metal layer with a first interlayer insulating film interposed between the first metal layer and the second metal layer, a third metal layer that is stacked above the second metal layer so as to be in contact with the second metal layer, and a first light-transmitting conductive layer that is stacked above the third metal layer so as to be in contact with the third metal layer, the insulating film has an opening that exposes the first light-transmitting conductive layer in a region overlapping each of the first terminals, and the anisotropic conductive film is in direct contact with a side surface of the insulating film forming the opening and with the first light-transmitting conductive layer overlapping the opening.

BRIEF DESCRIPTION OF THE DRAWINGS

FIG. 6 is a plan view illustrating the detection element on the array substrate;

DETAILED DESCRIPTION

Figure 1A:
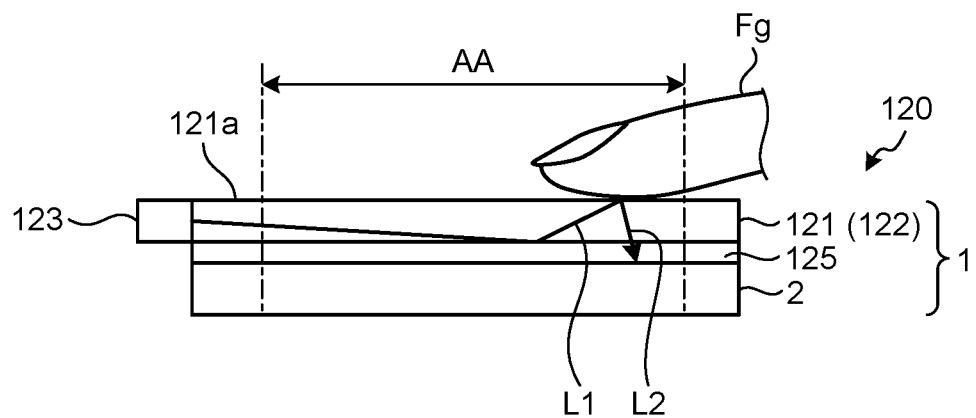
FIG. 1A is a sectional view illustrating a schematic sectional configuration of a detection apparatus having an illumination device, the detection apparatus including a detection device according to a first embodiment.

The following describes modes (embodiments) for carrying out the present invention in detail with reference to the drawings. The present invention is not limited to the description of the embodiments to be given below. Components to be described below include those easily conceivable by those skilled in the art or those substantially identical thereto. In addition, the components to be described below can be combined as appropriate. What is disclosed herein is merely an example, and the present invention naturally encompasses appropriate modifications easily conceivable by those skilled in the art while maintaining the gist of the invention. To further clarify the description, the drawings may schematically illustrate, for example, widths, thicknesses, and shapes of various parts as compared with actual aspects thereof. However, they are merely examples, and interpretation of the present invention is not limited thereto. The same component as that described with reference to an already mentioned drawing is denoted by the same reference numeral through the description and the drawings, and detailed description thereof may not be repeated where appropriate.

In the present specification and claims, in expressing an aspect of disposing a second structure above a first structure, a case of simply expressing "above" includes both a case of disposing the second structure immediately above the first structure so as to contact the first structure and a case of disposing the second structure above the first structure with a a third structure interposed therebetween, unless otherwise specified.

First Embodiment

Figure 1B:
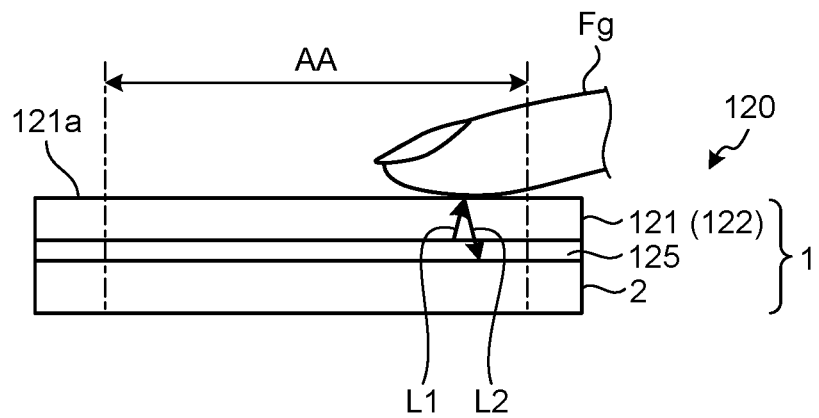
FIG. 1B is a sectional view illustrating a schematic sectional configuration of the detection apparatus having an illumination device, the detection apparatus including the detection device according to a first modification.
Figure 1C:
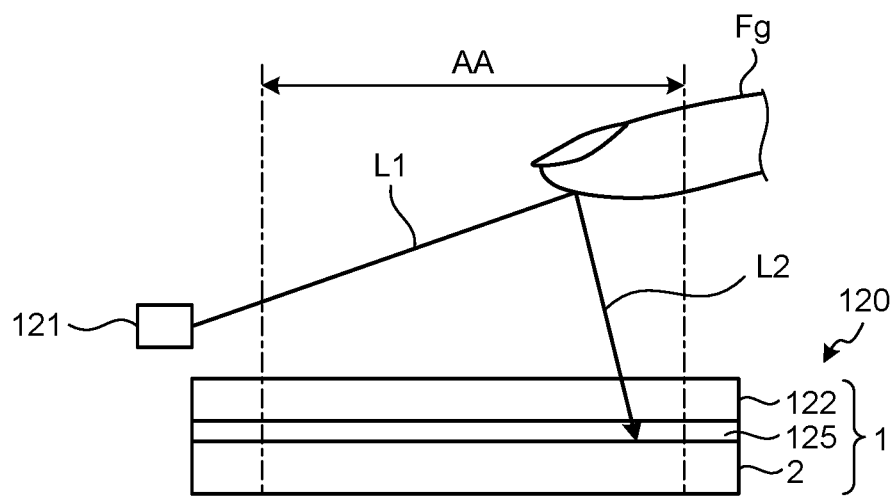
FIG. 1C is a sectional view illustrating a schematic sectional configuration of the detection apparatus having an illumination device, the detection apparatus including the detection device according to a second modification.
Figure 1D:
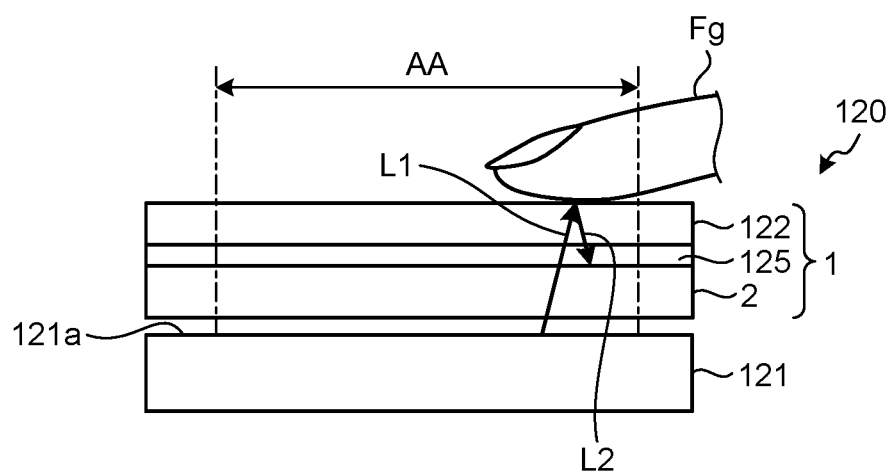
FIG. 1D is a sectional view illustrating a schematic sectional configuration of the detection apparatus having an illumination device, the detection apparatus including the detection device according to a third modification.

FIG. 1A is a sectional view illustrating a schematic sectional configuration of a detection apparatus having an illumination device, the detection apparatus including a detection device according to a first embodiment. FIG. 1B is a sectional view illustrating a schematic sectional configuration of the detection apparatus having an illumination device, the detection apparatus including the detection device according to a first modification. FIG. 1C is a sectional view illustrating a schematic sectional configuration of the detection apparatus having an illumination device, the detection apparatus including the detection device according to a second modification. FIG. 1D is a sectional view illustrating a schematic sectional configuration of the detection apparatus having an illumination device, the detection apparatus including the detection device according to a third modification.

As illustrated in FIG. 1A, a detection apparatus 120 having an illumination device includes a detection device 1 and an illumination device 121. The detection device 1 includes an array substrate 2, an adhesive layer 125, and a cover member 122. That is, the array substrate 2, the adhesive layer 125, and the cover member 122 are stacked in this order in a direction orthogonal to a surface of the array substrate 2. As will be describe later, the cover member 122 of the detection device 1 may be replaced with the illumination device 121.

As illustrated in FIG. 1A, the illumination device 121 may be, for example, what is called a side light-type front light that uses the cover member 122 as a light guide plate provided in a position corresponding a detection region AA of the detection device 1 and includes a plurality of light sources 123 arranged at one end or both ends of the cover member 122. That is, the cover member 122 has a light-emitting surface 121a for emitting light, and serves as one component of the illumination device 121. The illumination device 121 emits light L1 from the light-emitting surface 121a of the cover member 122 toward a finger Fg that serves as a detection target. For example, light-emitting diodes (LEDs) for emitting light in a predetermined color are used as the light sources.

As illustrated in FIG. 1B, the illumination device 121 may include the light sources (for example, LEDs) provided directly below the detection region AA of the detection device 1. The illumination device 121 including the light sources also serves as the cover member 122.

The illumination device 121 is not limited to the example of FIG. 1B. As illustrated in FIG. 1C, the illumination device 121 may be provided on a lateral side or an upper side of the cover member 122, and may emit the light L1 to the finger Fg from the lateral side or the upper side of the finger Fg.

Furthermore, as illustrated in FIG. 1D, the illumination device 121 may be what is called a direct-type backlight that includes the light sources (for example, LEDs) provided in the detection region of the detection device 1.

The light L1 emitted from the illumination device 121 is reflected as light L2 by the finger Fg serving as the detection target. The detection device 1 detects the light L2 reflected by the finger Fg to detect asperities (such as a fingerprint) on a surface of the finger Fg. The detection device 1 may further detect information on a living body by detecting the light L2 reflected in the finger Fg, in addition to detecting the fingerprint. Examples of the information on the living body include a blood vessel image, pulsation, and a pulse wave of, for example, a vein. The color of the light L1 from the illumination device 121 may be varied according to the detection target.

The cover member 122 is a member for protecting the array substrate 2, and covers the array substrate 2. The illumination device 121 may have a structure to serve also as the cover member 122, as described above. In the structures illustrated in FIGS. 1C and 1D in which the cover member 122 is separate from the illumination device 121, the cover member 122 is, for example, a glass substrate. The cover member 122 is not limited to the glass substrate, and may be a resin substrate, for example. The cover member 122 may be omitted. In that case, the surface of the array substrate 2 is provided with a protective layer of, for example, an insulating film, and the finger Fg contacts the protective layer of the detection device 1.

The detection apparatus 120 having an illumination device may be provided with a display panel instead of the illumination device 121, as illustrated in FIG. 1B. The display panel may be, for example, an organic electroluminescent (EL) (organic light-emitting diode (OLED)) display panel or an inorganic EL (micro-LED or mini-LED) display panel. Alternatively, the display panel may be a liquid crystal display (LCD) panel using liquid crystal elements as display elements or an electrophoretic display (EPD) panel using electrophoretic elements as the display elements. Even in this case, the fingerprint of the finger Fg and the information on the living body can be detected based on the light L2 obtained by reflecting display light (light L1) emitted from the display panel against the finger Fg.

Figure 2:
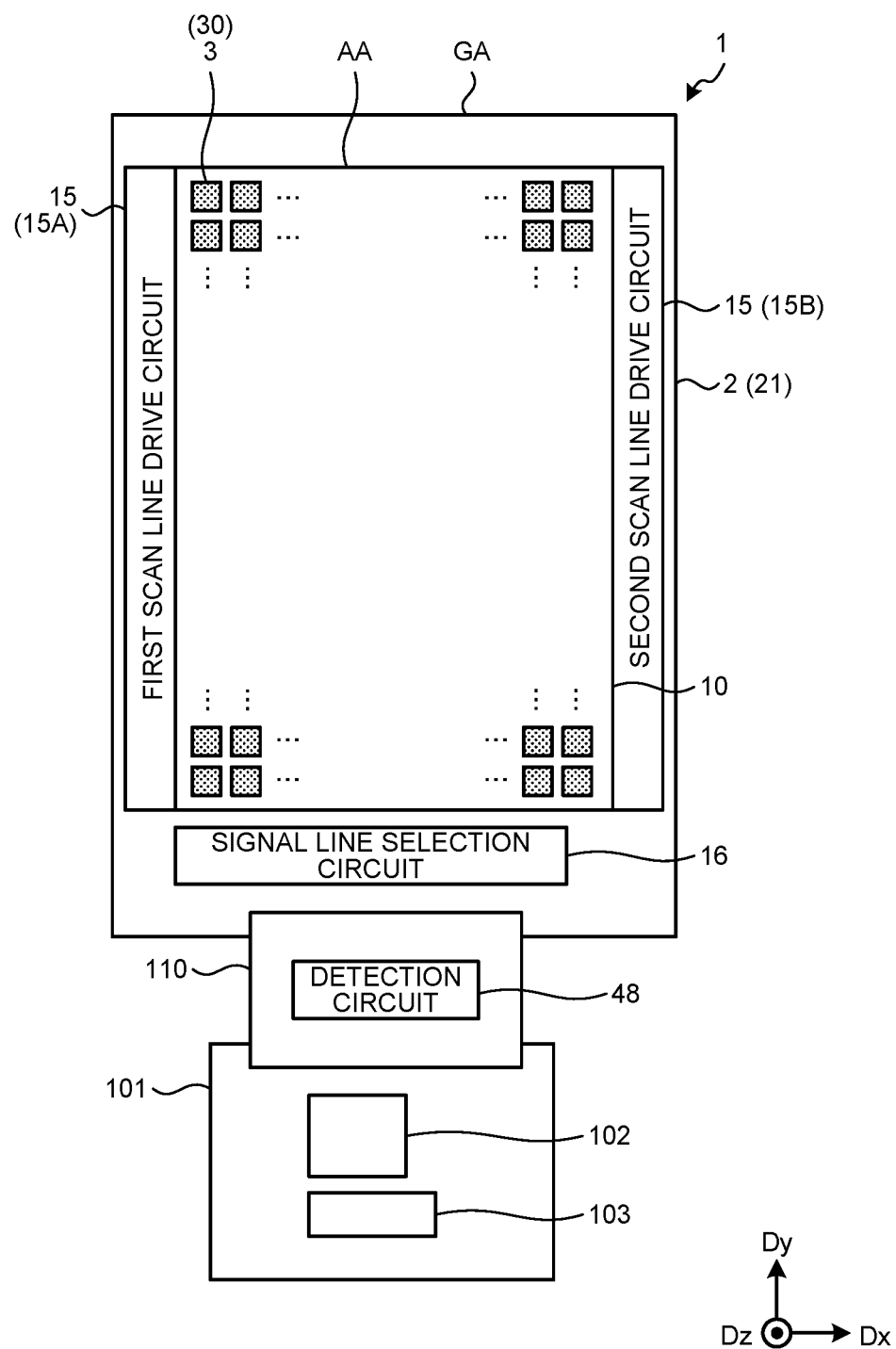
FIG. 2 is a plan view illustrating the detection device according to the first embodiment.

FIG. 2 is a plan view illustrating the detection device according to the first embodiment. A first direction Dx illustrated in FIG. 2 and the subsequent drawings is one direction in a plane parallel to a substrate 21. A second direction Dy is one direction in the plane parallel to the substrate 21, and is a direction orthogonal to the first direction Dx. The second direction Dy may non-orthogonally intersect the first direction Dx. A third direction Dz is a direction orthogonal to the first direction Dx and the second direction Dy, and is a direction normal to the substrate 21.

As illustrated in FIG. 2, the detection device 1 includes the array substrate 2 (substrate 21), a sensor unit 10, a scan line drive circuit 15 (first scan line drive circuit 15A and second scan line drive circuit 15B), a signal line selection circuit 16, a detection circuit 48, a control circuit 102, and a power supply circuit 103.

The substrate 21 is electrically coupled to a control substrate 101 through a wiring substrate 110. The wiring substrate 110 is, for example, a flexible printed circuit board or a rigid circuit board. The wiring substrate 110 is provided with the detection circuit 48. The control substrate 101 is provided with the control circuit 102 and the power supply circuit 103. The control circuit 102 is, for example, a field-programmable gate array (FPGA). The control circuit 102 supplies control signals to the sensor unit 10, the scan line drive circuit 15, and the signal line selection circuit 16 to control an operation of the sensor unit 10. The power supply circuit 103 supplies voltage signals including, for example, a power supply potential VDD and a reference potential VCOM (refer to FIG. 4) to the sensor unit 10, the scan line drive circuit 15, and the signal line selection circuit 16. In the present embodiment, the case is exemplified where the detection circuit 48 is disposed on the wiring substrate 110, but the present invention is not limited to this case. The detection circuit 48 may be disposed on the substrate 21.

The substrate 21 has the detection region AA and a peripheral region GA. The detection region AA and the peripheral region GA extend in planar directions parallel to the substrate 21. Elements (detection elements 3) of the sensor unit 10 are provided in the detection region AA. The peripheral region GA is a region outside the detection region AA, and is a region not provided with the elements (detection elements 3). That is, the peripheral region GA is a region between the outer periphery of the detection region AA and the outer edges of the substrate 21.

The scan line drive circuit 15 and the signal line selection circuit 16 are provided in the peripheral region GA. The scan line drive circuit 15 is provided in a region extending along the second direction Dy in the peripheral region GA. The scan line drive circuit 15 includes the first scan line drive circuit 15A and the second scan line drive circuit 15B. The first scan line drive circuit 15A and the second scan line drive circuit 15B are arranged adjacent to each other in the first direction Dx with the detection region AA interposed therebetween. In the following description, the first scan line drive circuit 15A and the second scan line drive circuit 15B are simply called the scan line drive circuit 15 when they need not be distinguished from each other. The signal line selection circuit 16 is provided in a region extending along the first direction Dx in the peripheral region GA, and is provided between the sensor unit 10 and the detection circuit 48.

Each of the detection elements 3 of the sensor unit 10 is an optical sensor including a photodiode 30 as a sensor element. The photodiode 30 is a photoelectric conversion element, and outputs an electrical signal corresponding to light irradiating each of the photodiodes 30. More specifically, the photodiode 30 is a positive-intrinsic-negative (PIN) photodiode. The photodiode 30 may be paraphrased as an organic photodiode (OPD). The detection elements 3 are arranged in a matrix having a row-column configuration in the detection region AA. The photodiode 30 included in each of the detection elements 3 performs the detection according to gate drive signals (for example, a reset control signal RST and a read control signal RD) supplied from the scan line drive circuit 15. Each of the photodiodes 30 outputs the electrical signal corresponding to the light irradiating the photodiode 30 as a detection signal Vdet to the signal line selection circuit 16. The detection device 1 detects the information on the living body based on the detection signals Vdet received from the photodiodes 30.

Figure 3:
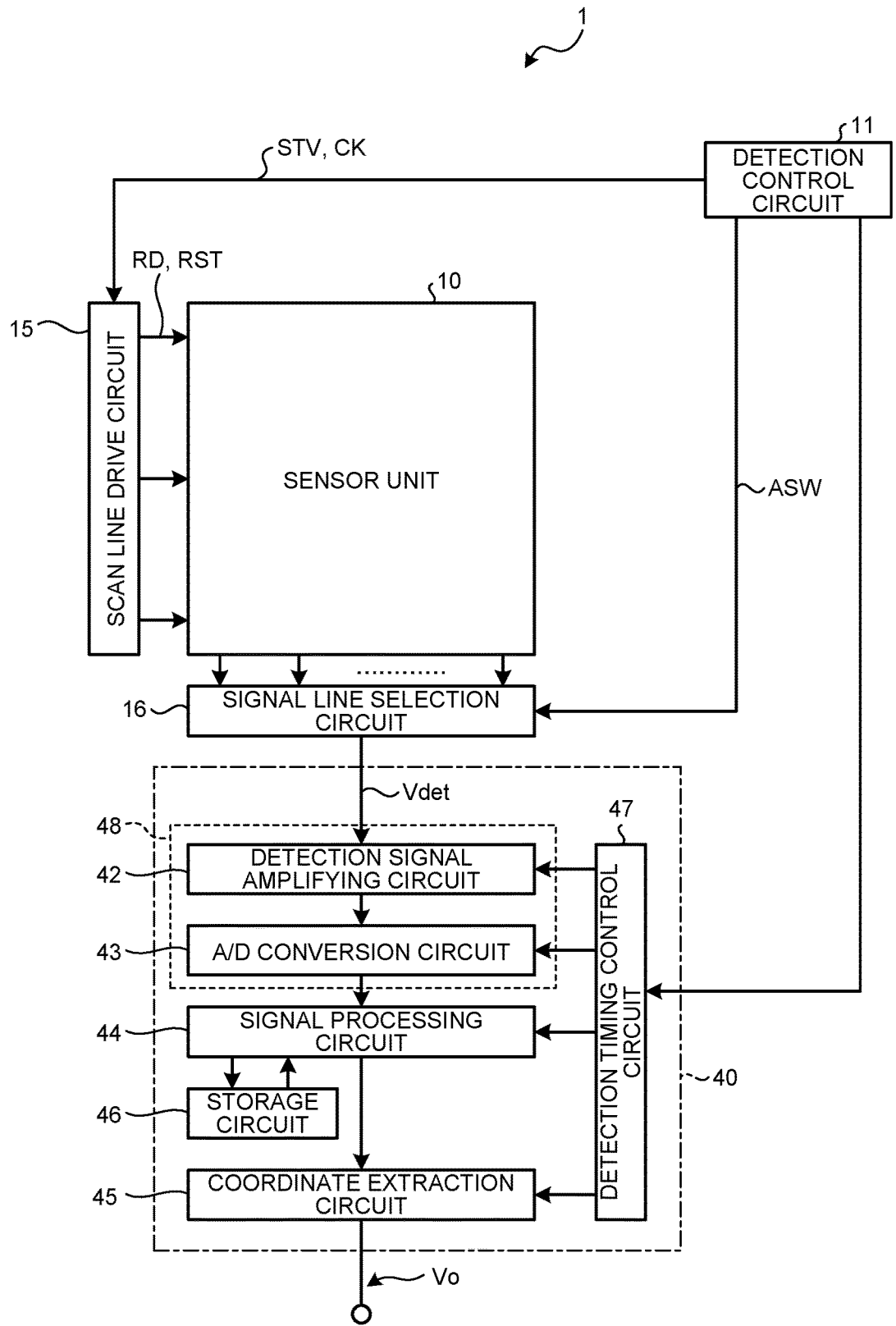
FIG. 3 is a block diagram illustrating a configuration example of the detection device according to the first embodiment.

FIG. 3 is a block diagram illustrating a configuration example of the detection device according to the first embodiment. As illustrated in FIG. 3, the detection device 1 further includes a detection control circuit 11 and a detector 40. The control circuit 102 includes one, some, or all functions of the detection control circuit 11. The control circuit 102 also includes one, some, or all functions of the detector 40 other than those of the detection circuit 48.

The detection control circuit 11 is a circuit that supplies respective control signals to the scan line drive circuit 15, the signal line selection circuit 16, and the detector 40 to control operations of these components. The detection control circuit 11 supplies various control signals including, for example, a start signal STV and a clock signal CK to the scan line drive circuit 15. The detection control circuit 11 also supplies various control signals including, for example, a selection signal ASW to the signal line selection circuit 16.

The scan line drive circuit 15 is a circuit that drives a plurality of scan lines (read control scan line GLrd and reset control scan line GLrst (refer to FIG. 4)) based on the various control signals. For example, the first scan line drive circuit 15A (refer to FIG. 2) scans one of the read control scan line GLrd and the reset control scan line GLrst. The second scan line drive circuit 15B (refer to FIG. 2) scans the other of the read control scan line GLrd and the reset control scan line GLrst. The scan line drive circuit 15 sequentially or simultaneously selects the scan lines, and supplies the gate drive signals (for example, the reset control signals RST and the read control signals RD) to the selected scan lines. Through this operation, the scan line drive circuit 15 selects the photodiodes 30 coupled to the scan lines.

Figure 4:
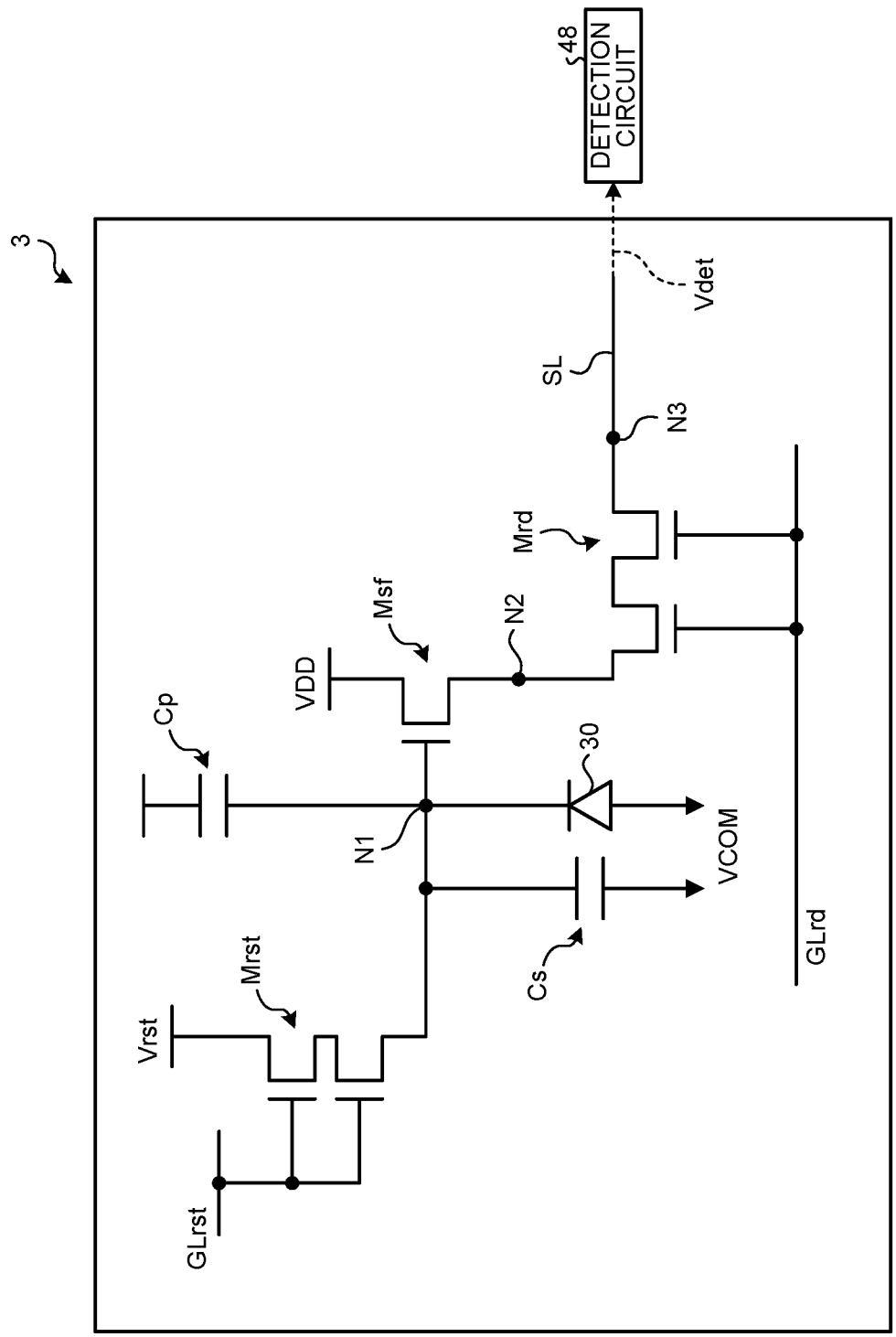
FIG. 4 is a circuit diagram illustrating a detection element.

The signal line selection circuit 16 is a switch circuit that sequentially or simultaneously selects a plurality of output signal lines SL (refer to FIG. 4). The signal line selection circuit 16 is, for example, a multiplexer. The signal line selection circuit 16 couples the selected output signal lines SL to the detection circuit 48 based on the selection signal ASW supplied from the detection control circuit 11. Through this operation, the signal line selection circuit 16 outputs the detection signals Vdet of the photodiodes 30 to the detector 40.

The detector 40 includes the detection circuit 48, a signal processing circuit 44, a coordinate extraction circuit 45, a storage circuit 46, and a detection timing control circuit 47. The detection timing control circuit 47 performs control to cause the detection circuit 48, the signal processing circuit 44, and the coordinate extraction circuit 45 to operate in synchronization with one another based on a control signal supplied from the detection control circuit 11.

The detection circuit 48 is, for example, an analog front-end (AFE) circuit. The detection circuit 48 is a signal processing circuit having functions of at least a detection signal amplifying circuit 42 and an analog-to-digital (A/D) conversion circuit 43. The detection signal amplifying circuit 42 amplifies the detection signal Vdet, and is an integration circuit, for example. The A/D conversion circuit 43 converts an analog signal output from the detection signal amplifying circuit 42 into a digital signal.

The signal processing circuit 44 is a logic circuit that detects a predetermined physical quantity received by the sensor unit 10 based on output signals of the detection circuit 48. The signal processing circuit 44 can detect asperities on the surface of the finger Fg or a palm based on the signals from the detection circuit 48 when the finger Fg is in contact with or in proximity to a detection surface. The signal processing circuit 44 may detect the information on the living body based on the signals from the detection circuit 48. Examples of the information on the living body include a blood vessel image, a pulse wave, pulsation, and a blood oxygen saturation level of the finger Fg or the palm. That is, the detection device 1 may be configured as a fingerprint sensor for detecting the fingerprint or a vein sensor for detecting a vascular pattern of, for example, veins.

The storage circuit 46 temporarily stores therein signals calculated by the signal processing circuit 44. The storage circuit 46 may be, for example, a random-access memory (RAM) or a register circuit.

The coordinate extraction circuit 45 is a logic circuit that obtains detected coordinates of the asperities on the surface of the finger Fg or the like when the contact or proximity of the finger Fg is detected by the signal processing circuit 44. The coordinate extraction circuit 45 is the logic circuit that also obtains detected coordinates of blood vessels of the finger Fg or the palm. The coordinate extraction circuit 45 combines the detection signals Vdet output from the respective detection elements 3 of the sensor unit 10 to generate two-dimensional information representing a shape of the asperities on the surface of the finger Fg or the like. The coordinate extraction circuit 45 may output the detection signals Vdet as sensor outputs Vo instead of calculating the detected coordinates.

The following describes a circuit configuration example of the detection device 1. FIG. 4 is a circuit diagram illustrating the detection element. As illustrated in FIG. 4, the detection element 3 includes the photodiode 30, a reset transistor Mrst, a read transistor Mrd, and a source follower transistor Msf. The reset transistor Mrst, the read transistor Mrd, and the source follower transistor Msf are provided correspondingly to each of the photodiodes 30. The reset transistor Mrst, the read transistor Mrd, and the source follower transistor Msf are each constituted by an n-type thin-film transistor (TFT). However, each of the transistors is not limited thereto, and may be constituted by a p-type TFT.

The reference potential VCOM is applied to an anode of the photodiode 30. A cathode of the photodiode 30 is coupled to a node N1. The node N1 is coupled to a capacitive element Cs, one of the source and the drain of the reset transistor Mrst, and the gate of the source follower transistor Msf. The node N1 further has parasitic capacitance Cp. When light is incident on the photodiode 30, a signal (electric charge) output from the photodiode 30 is stored in the capacitive element Cs. The capacitive element Cs is a capacitor formed between an upper electrode 34 and a lower electrode 35 (refer to FIG. 7) that are coupled to the photodiode 30. The parasitic capacitance Cp is capacitance added to the capacitive element Cs, and is capacitance generated among various types of wiring and electrodes provided on the array substrate 2.

The gate of the reset transistor Mrst is coupled to the reset control scan line GLrst. The other of the source and the drain of the reset transistor Mrst is coupled to a reset signal line SLrst, and is supplied with a reset potential Vrst. When the reset transistor Mrst is turned on (into a conduction state) in response to the reset control signal RST, the potential of the node N1 is reset to the reset potential Vrst. The reference potential VCOM is lower than the reset potential Vrst, and the photodiode 30 is driven in a reverse bias state.

The source follower transistor Msf is coupled between a terminal supplied with the power supply potential VDD and the read transistor Mrd (node N2). The gate of the source follower transistor Msf is coupled to the node N1. The gate of the source follower transistor Msf is supplied with a signal (electric charge) generated by the photodiode 30. This operation causes the source follower transistor Msf to output a voltage signal corresponding to the signal (electric charge) generated by the photodiode 30 to the read transistor Mrd.

The read transistor Mrd is coupled between the source of the source follower transistor Msf (node N2) and a corresponding one of the output signal lines SL (node N3). The gate of the read transistor Mrd is coupled to the read control scan line GLrd. When the read transistor Mrd is turned on in response to the read control signal RD, the signal output from the source follower transistor Msf, that is, the voltage signal corresponding to the signal (electric charge) generated by the photodiode 30 is output as the detection signal Vdet to the output signal line SL.

In the example illustrated in FIG. 4, the reset transistor Mrst and the read transistor Mrd each have what is called a double-gate structure configured by coupling two transistors in series. However, the reset transistor Mrst and the read transistor Mrd are not limited to this structure, and may have a single-gate structure, or a multi-gate structure including three or more transistors coupled in series. The circuit of each of the detection elements 3 is not limited to the configuration including the three transistors of the reset transistor Mrst, the source follower transistor Msf, and the read transistor Mrd. The detection element 3 may include two transistors, or four or more transistors.

Figure 5:
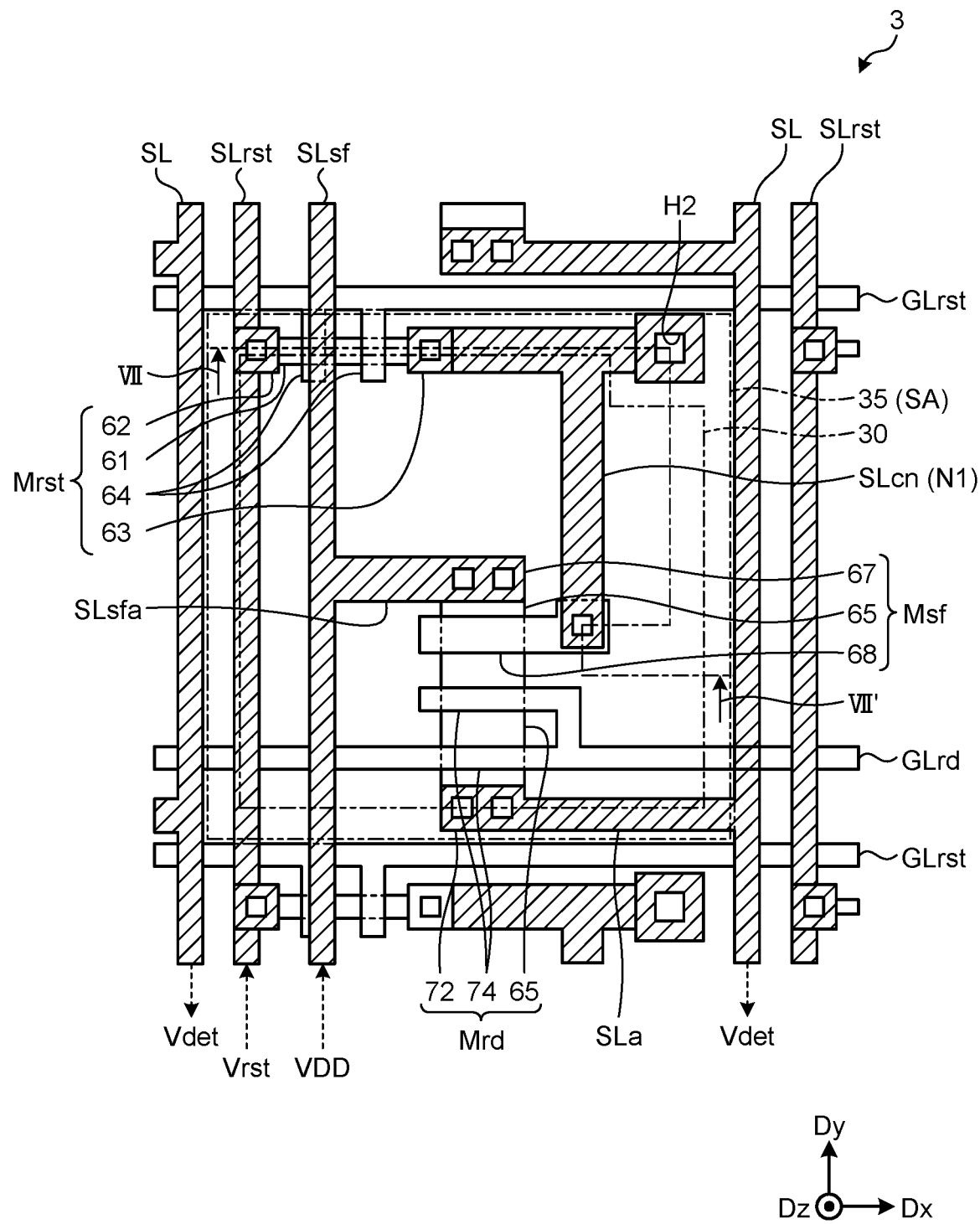
FIG. 5 is a plan view illustrating an array substrate on which the detection element is formed.

The following describes a planar configuration of the detection element 3. FIG. 5 is a plan view illustrating the array substrate on which the detection element is formed. FIG. 6 is a plan view illustrating the detection element on the array substrate. FIG. 5 is a plan view schematically illustrating a portion of the detection element 3, that is, a portion thereof except members above the photodiode 30. FIG. 5 illustrates the lower electrode 35 and the photodiode 30 with long dashed double-short dashed lines.

As illustrated in FIG. 5, the reset control scan lines GLrst each extend in the first direction Dx, and are separately arranged in the second direction Dy. The output signal lines SL each extend in the second direction Dy, and are separately arranged in the first direction Dx. The photodiode 30 of the detection element 3 is provided in a region surrounded by two of the reset control scan lines GLrst adjacent in the second direction Dy and two of the output signal lines SL adjacent in the first direction Dx.

The detection element 3 further includes the read control scan line GLrd and two signal lines (power supply signal line SLsf and reset signal line SLrst). The read control scan line GLrd extends in the first direction Dx, and is arranged side by side with the reset control scan line GLrst in the second direction Dy. Each of the power supply signal line SLsf and the reset signal line SLrst extends in the second direction Dy, and is arranged side by side with the output signal line SL in the first direction Dx.

As illustrated in FIG. 5, the reset transistor Mrst of the detection element 3 includes a first semiconductor layer 61, a source electrode 62, a drain electrode 63, and gate electrodes 64. One end of the first semiconductor layer 61 is coupled to the reset signal line SLrst. The other end of the first semiconductor layer 61 is coupled to coupling wiring SLcn. A portion of the reset signal line SLrst coupled to the first semiconductor layer 61 serves as the source electrode 62, and a portion of the coupling wiring SLcn coupled to the first semiconductor layer 61 serves as the drain electrode 63.

The gate electrodes 64 face the first semiconductor layer 61. More specifically, the reset control scan line GLrst is provided with two branches branching in the second direction Dy, and the first semiconductor layer 61 extends in the first direction Dx and intersects the two branches of the reset control scan line GLrst. Channel regions are formed at portions of the first semiconductor layer 61 overlapping the two branches of the reset control scan line GLrst, and portions of the two branches of the reset control scan line GLrst that overlap the first semiconductor layer 61 serve as the gate electrodes 64. Thus, the reset transistor Mrst is configured as a double-gate structure in which the two gate electrodes 64 are provided so as to overlap the first semiconductor layer 61.

The source follower transistor Msf of the detection element 3 includes a second semiconductor layer 65, a source electrode 67, and a gate electrode 68. One end of the second semiconductor layer 65 is coupled to the power supply signal line SLsf through a coupling portion SLsfa. The other end of the second semiconductor layer 65 is coupled to the read transistor Mrd. A portion of the coupling portion SLsfa coupled to the second semiconductor layer 65 serves as the source electrode 67.

One end of the gate electrode 68 is coupled to the coupling wiring SLcn through a contact hole. The second semiconductor layer 65 intersects the gate electrode 68. A channel region is formed at a portion of the second semiconductor layer 65 intersecting the gate electrode 68. The source follower transistor Msf is configured as a single-gate structure in which the one gate electrode 68 is provided so as to overlap the second semiconductor layer 65. The reset transistor Mrst is electrically coupled to the gate of the source follower transistor Msf through the coupling wiring SLcn.

The coupling wiring SLcn is disposed between the power supply signal line SLsf and the output signal line SL adjacent to each other in the first direction Dx. The coupling wiring SLcn includes a portion that is coupled to the reset transistor Mrst and extends in the first direction Dx, and a portion that is coupled to the source follower transistor Msf and extends in the second direction Dy. The cathode (n-type semiconductor layer 33) of the photodiode 30 of the detection element 3 is coupled to the coupling wiring SLcn through a contact hole H2. This configuration electrically couples the cathode (n-type semiconductor layer 33) of the photodiode 30 to the reset transistor Mrst and the source follower transistor Msf through the coupling wiring SLcn.

The read transistor Mrd includes the second semiconductor layer 65, a drain electrode 72, and gate electrodes 74. The second semiconductor layer 65 of the read transistor Mrd is formed of a semiconductor layer integrated with the second semiconductor layer 65 of the source follower transistor Msf. In other words, the read transistor Mrd and the source follower transistor Msf include the common second semiconductor layer 65. The other end of the second semiconductor layer 65 of the read transistor Mrd is coupled to the output signal line SL through a coupling portion SLa. In other words, a portion of the coupling portion SLa coupled to the second semiconductor layer 65 serves as the drain electrode 72.

The read control scan line GLrd is coupled to a branch that is adjacent thereto in the second direction Dy and extends in the first direction Dx. The second semiconductor layer 65 intersects the read control scan line GLrd and the branch. Portions of the read control scan line GLrd and the branch thereof that overlap the second semiconductor layer 65 serve as the gate electrodes 74. Thus, the read transistor Mrd is configured as a double-gate structure in which the two gate electrodes 74 are provided so as to overlap the second semiconductor layer 65.

In the present embodiment, the second semiconductor layer 65 is arranged adjacent in the first direction Dx to the output signal line SL, and the second semiconductor layer 65 and the output signal line SL extend in the second direction Dy. The two gate electrodes 74 included in the read transistor Mrd and the one gate electrode 68 included in the source follower transistor Msf are arranged in the second direction Dy so as to overlap the second semiconductor layer 65. With this configuration, the source follower transistor Msf having a single-gate structure and the read transistor Mrd having a double-gate structure include the common second semiconductor layer 65.

Such a configuration can arrange the transistors and the wiring more efficiently than when forming each of the read transistor Mrd and the source follower transistor Msf from an individual semiconductor layer. In the present embodiment, the read transistor Mrd has a double-gate structure, so that a leakage current can be restrained from flowing toward the output signal line SL.

As illustrated in FIGS. 5 and 6, the photodiode 30 is provided in the region surrounded by the two of the reset control scan lines GLrst adjacent in the second direction Dy and the two of the output signal lines SL adjacent in the first direction Dx. The upper electrode 34 and the lower electrode 35 face each other with the photodiode 30 interposed therebetween in the third direction Dz. An overlapping electrode 37 is further provided so as to overlap the upper electrode 34. Specifically, the photodiode 30 is disposed above the array substrate 2 provided with the various types of wiring and the various transistors with the lower electrode 35 interposed therebetween.

The lower electrode 35 has a larger area than the photodiode 30 and the upper electrode 34 in the plan view. The lower electrode 35 is electrically coupled to the reset transistor Mrst and the source follower transistor Msf through the contact hole H2 at a portion overlapping neither the photodiode 30 nor the upper electrode 34. The upper electrode 34 is provided so as to cover the photodiode 30. A contact hole H1 provided in an insulating film 27 is provided so as to overlap most of the region of the upper electrode 34, and the insulating film 27 overlaps the upper electrode 34 only at the periphery of the upper electrode 34.

The overlapping electrode 37 is provided so as to cover the contact hole H1 of the insulating film 27, and is coupled to the upper electrode 34 in a region overlapping the contact hole H1. Coupling wiring 36 is coupled to the overlapping electrode 37 in the region thereof overlapping the contact hole H1. The above-described configuration electrically couples the photodiode 30 to reference potential supply wiring SLcom through the upper electrode 34, the overlapping electrode 37, and the coupling wiring 36. The reference potential supply wiring SLcom is wiring for supplying the reference potential VCOM to the photodiode 30, and is provided extending in the second direction Dy so as to overlap the output signal line SL.

As illustrated in FIGS. 5 and 6, the photodiode 30 and the lower electrode 35 are provided so as to overlap the various types of wiring and the various transistors (reset transistor Mrst, read transistor Mrd, and source follower transistor Msf). The photodiode 30 and the lower electrode 35 are provided so as to partially overlap the signal lines and the scan lines (power supply signal line SLsf, reset signal line SLrst, and read control scan line GLrd). A sensor region SA of the detection element 3 is defined by the lower electrode 35 coupled to the photodiode 30. The optical sensitivity (sensor output) of the detection device 1 can be improved by increasing the area of the sensor region SA.

Figure 7:
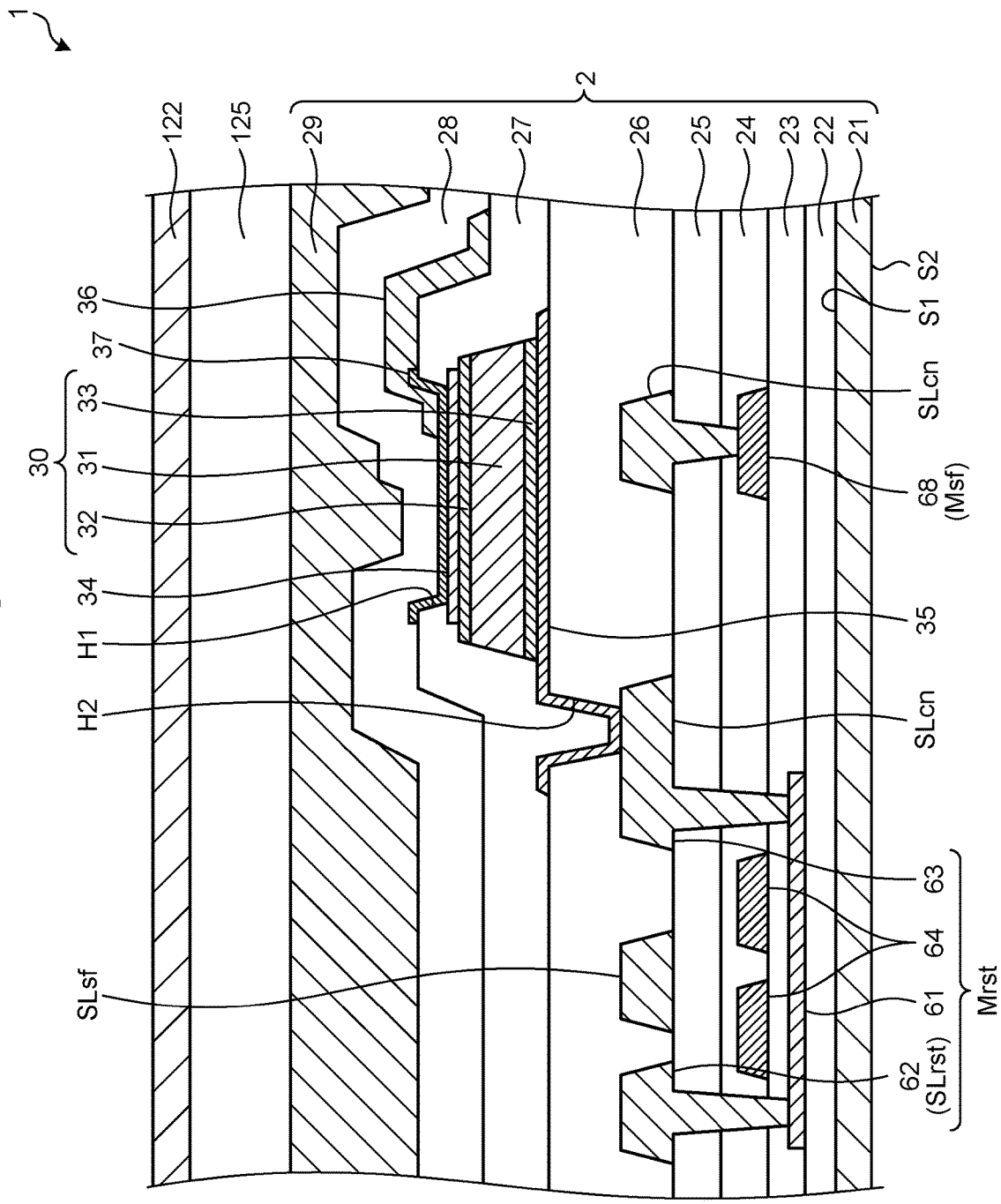
FIG. 7 is a VII-VII' sectional view of FIG. 5.

The following describes a sectional configuration of the detection element 3. FIG. 7 is a VII-VII' sectional view of FIG. 5. While FIG. 7 illustrates a sectional configuration of the reset transistor Mrst among the three transistors included in the detection element 3, each of the source follower transistor Msf and the read transistor Mrd also has a sectional configuration similar to that of the reset transistor Mrst.

As illustrated in FIG. 7, the substrate 21 is an insulating substrate. A glass substrate of, for example, quartz or alkali-free glass is used as the substrate 21. The substrate 21 has a first principal surface S1, and a second principal surface S2 on the opposite side of the first principal surface S1. The various transistors including the reset transistor Mrst, the various types of wiring (scan lines and signal lines), and insulating films are provided on the first principal surface S1 of the substrate 21 to form the array substrate 2. The photodiodes 30 are arranged above the array substrate 2, that is, on the first principal surface S1 side of the substrate 21.

An undercoat film 22 is provided on the first principal surface S1 of the substrate 21. The undercoat film 22, insulating films 23, 24, and 25, the insulating film 27 and an insulating film 28 are inorganic insulating films, and are formed of, for example, silicon oxide ($SiO_2$) or silicon nitride (SiN).

The first semiconductor layer 61 is provided above the undercoat film 22. For example, polysilicon is used as the first semiconductor layer 61. The first semiconductor layer 61 is, however, not limited thereto, and may be formed of, for example, a microcrystalline oxide semiconductor, an amorphous oxide semiconductor, or low-temperature polycrystalline silicon (LTPS).

The insulating film 23 is provided above the undercoat film 22 so as to cover the first semiconductor layer 61. The gate electrodes 64 are provided above the insulating film 23. The gate electrode 68 of the source follower transistor Msf is provided in the same layer as that of the gate electrodes 64, and is also provided above the insulating film 23. The reset control scan line GLrst and the read control scan line GLrd are also provided in the same layer as that of the gate electrodes 64. The insulating film 24 is provided above the insulating film 23 so as to cover the gate electrodes 64.

As illustrated in FIG. 7, the reset transistor Mrst has a top-gate structure in which the gate electrodes 64 are provided above the first semiconductor layer 61. However, in the detection device 1 of the present disclosure, the reset transistor Mrst may have a bottom-gate structure in which the gate electrodes 64 are provided below the first semiconductor layer 61, or a dual-gate structure in which the gate electrodes 64 are provided above and below the first semiconductor layer 61.

The insulating films 24 and 25 are provided above the insulating film 23 so as to cover the gate electrodes 64. The source electrode 62 and the drain electrode 63 are provided above the insulating film 25. The insulating films 24 and 25 serve as a first interlayer insulating film that insulates the gate electrodes 64 from the source and the drain electrodes 62 and 63. The source and the drain electrodes 62 and 63 are each coupled to the first semiconductor layer 61 through a contact hole passing through the insulating films 23, 24, and 25. The source and the drain electrodes 62 and 63 are formed of, for example, a multilayered film of Ti—Al—Ti layers or Ti—Al layers that has a multilayered structure of titanium and aluminum.

The various signal lines (output signal line SL, power supply signal line SLsf, and reset signal line SLrst) and the coupling wiring SLcn are provided in the same layer as that of the source and the drain electrodes 62 and 63. The coupling wiring SLcn of the detection element 3 is coupled to the gate electrode 68 of the source follower transistor Msf through a contact hole passing through the insulating films 24 and 25.

As illustrated in FIG. 7, an insulating film 26 is provided above the insulating film 25 so as to cover the various transistors, including the reset transistor Mrst, for example. The insulating film 26 is formed of an organic material such as a photosensitive acrylic. The insulating film 26 is thicker than the insulating film 25. The insulating film 26 has a better step covering property than that of inorganic insulating materials, and can planarize steps formed by the various transistors and the various types of wiring.

The following describes a sectional configuration of the photodiode 30. The photodiode 30 is provided above the insulating film 26. Specifically, the lower electrode 35 is provided above the insulating film 26, and is electrically coupled to the coupling wiring SLcn through the contact hole H2. The photodiode 30 is coupled to the lower electrode 35. The lower electrode 35 can employ, for example, a multilayered structure of titanium (Ti) and titanium nitride (TiN). Since the lower electrode 35 is provided between the substrate 21 and the photodiode 30, the lower electrode 35 serves as a light-blocking layer, and can restrain light from entering the photodiode 30 from the second principal surface S2 side of the substrate 21.

The photodiode 30 includes a semiconductor layer having a photovoltaic effect. Specifically, the semiconductor layer of the photodiode 30 includes an i-type semiconductor layer 31, a p-type semiconductor layer 32, and the n-type semiconductor layer 33. The i-type semiconductor layer 31, the p-type semiconductor layer 32, and the n-type semiconductor layer 33 are formed of, for example, amorphous silicon (a-Si). The material of the semiconductor layers is not limited thereto, and may be, for example, polysilicon or microcrystalline silicon.

The a-Si of the p-type semiconductor layer 32 is doped with impurities to form a p+ region. The a-Si of the n-type semiconductor layer 33 is doped with impurities to form an n+ region. The i-type semiconductor layer 31 is, for example, a non-doped intrinsic semiconductor, and has lower electric conductivity than that of the p-type semiconductor layer 32 and the n-type semiconductor layer 33.

The i-type semiconductor layer 31 is provided between the n-type semiconductor layer 33 and the p-type semiconductor layer 32 in the direction orthogonal to the surface of the substrate 21 (in the third direction Dz). In the present embodiment, the n-type semiconductor layer 33, the i-type semiconductor layer 31, and the p-type semiconductor layer 32 are stacked in this order above the lower electrode 35. In the present embodiment, the upper electrode 34 serves as the anode of the photodiode 30, and the lower electrode 35 serves as the cathode of the photodiode 30. The order of stacking of the n-type semiconductor layer 33, the i-type semiconductor layer 31, and the p-type semiconductor layer 32 may be reversed.

The n-type semiconductor layer 33 of the photodiode 30 of the detection element 3 is electrically coupled to the reset transistor Mrst and the source follower transistor Msf through the lower electrode 35 and the coupling wiring SLcn.

The upper electrode 34 is provided above the p-type semiconductor layer 32. The upper electrode 34 is formed of, for example, a light-transmitting conductive material such as indium tin oxide (ITO). The insulating film 27 is provided above the insulating film 26 so as to cover the photodiode 30 and the upper electrode 34. The insulating film 27 is provided with the contact hole H1 (opening) in a region overlapping the upper electrode 34.

The overlapping electrode 37 is provided above the upper electrode 34, and is electrically coupled to the upper electrode 34 at the bottom of the contact hole H1. The overlapping electrode 37 is formed of a light-transmitting conductive material such as ITO that is the same as the material of the upper electrode 34. The overlapping electrode 37 is provided along the inner wall of the contact hole H1 and the upper surface of the insulating film 27, and covers the boundary portion between the upper electrode 34 and the insulating film 27. The coupling wiring 36 is coupled to the overlapping electrode 37 in the region thereof overlapping the contact hole H1. The above-described configuration electrically couples the photodiode 30 to the reference potential supply wiring SLcom through the upper electrode 34, the overlapping electrode 37, and the coupling wiring 36. The p-type semiconductor layer 32 is supplied with the reference potential VCOM (refer to FIG. 4) through the coupling wiring 36, the overlapping electrode 37, and the upper electrode 34.

As illustrated in FIG. 6, the overlapping electrode 37 is provided so as to cover the entire region of the contact hole H1. In other words, the inner wall of contact hole H1 is located inside the outer periphery of the overlapping electrode 37. In the present embodiment, the overlapping electrode 37 serves as a protective film for the photodiode 30, and can restrain water or the like from entering the photodiode 30 side. When layers (for example, the coupling wiring 36 and the reference potential supply wiring SLcom) above the photodiode 30 are patterned in the manufacturing process of a detection device 1B, the overlapping electrode 37 serves as the protective film to restrain the photodiode 30 from being damaged. For example, since the overlapping electrode 37 is provided so as to cover the interface between the upper electrode 34 and the insulating film 27, the etchant can be restrained from entering the photodiode 30 side through the interface. However, the overlapping electrode 37 of the photodiode 30 may not be formed. In that case, the structure is such that the coupling wiring 36 is in direct contact with the upper electrode 34. By not forming the overlapping electrode 37 over the photodiode 30, the photodiode 30 can be improved in detection accuracy as compared with the structure in which the overlapping electrode 37 overlaps the upper electrode 34.

As illustrated in FIG. 7, the insulating film 28 is provided above the insulating film 27 so as to cover the upper electrode 34, the overlapping electrode 37, and the coupling wiring 36. The insulating film 28 is provided as a protective layer for restraining water from entering the photodiode 30. In addition, an insulating film 29 is provided above the insulating film 28. The insulating film 29 is a hard coat film formed of an organic material. The insulating film 29 planarizes steps formed on a surface of the insulating film 28 by the photodiode 30 and the coupling wiring 36.

The cover member 122 is provided so as to face the array substrate 2. That is, the cover member 122 is provided so as to cover the various transistors and the photodiode 30. In more detail, the adhesive layer 125 bonds the insulating film 29 of the array substrate 2 to the cover member 122. The adhesive layer 125 is, for example, a light-transmitting optical clear adhesive (OCA) sheet.

As described above, in the present embodiment, the insulating film 26 is provided so as to cover the transistors such as the reset transistor Mrst, and the lower electrode 35, the photodiode 30, and the upper electrode 34 are stacked in this order above the insulating film 26. Since the lower electrode 35, the photodiode 30, and the upper electrode 34 are provided in layers different from those of the transistors, the signal lines, and the scan lines, the degree of freedom of arrangement of the photodiode 30 and the lower electrode 35 can be improved, as described above.

Figure 8:
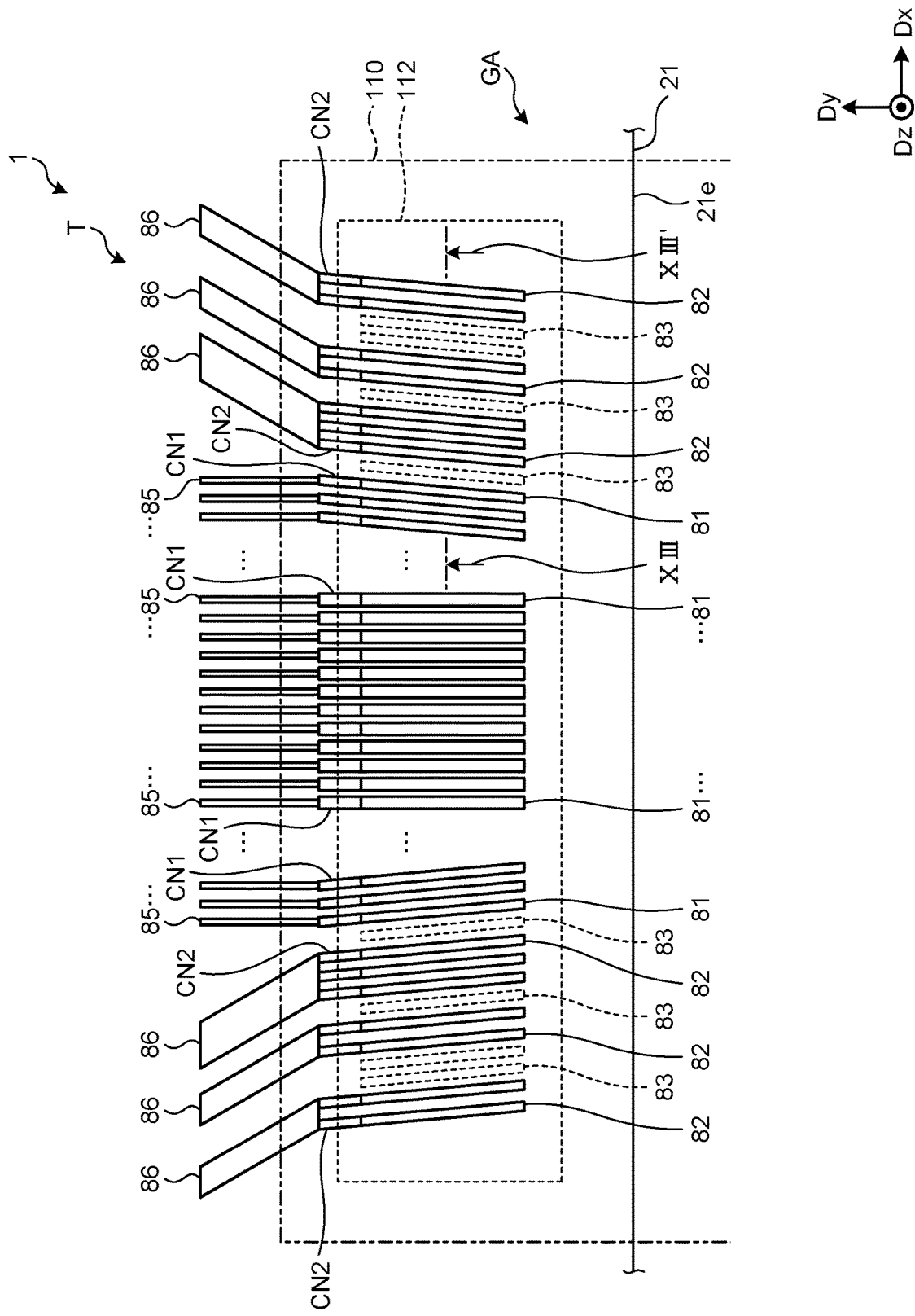
FIG. 8 is a plan view schematically illustrating a configuration of a terminal portion of the detection device according to the first embodiment.

The following describes a terminal portion T that electrically couples the array substrate 2 to the wiring substrate 110. FIG. 8 is a plan view schematically illustrating a configuration of the terminal portion of the detection device according to the first embodiment. As illustrated in FIG. 8, the terminal portion T includes a plurality of first terminals 81 and a plurality of second terminals 82. The first terminals 81 are arranged in the first direction Dx in the peripheral region GA of the substrate 21. Each of the first terminals 81 extends in the second direction Dy, and an end thereof in the second direction Dy is coupled to signal line coupling wiring 85 through a first contact portion CN1. Each wire of the signal line coupling wiring 85 extends in the second direction Dy, and is electrically coupled to the output signal line SL in the detection region AA through the signal line selection circuit 16 (refer to FIG. 2). The first terminals 81 output the detection signals Vdet from the photodiodes 30 in the detection region AA to external circuitry. The signal line coupling wiring 85 need not be coupled to the end of the first terminal 81. The location where the first terminal 81 is coupled to the signal line coupling wiring 85 need not be the end of the first terminal 81, and may be, for example, the center of the first terminal 81. That is, the location of the first contact portion CN1 is not limited to the end of the first terminal 81.

The second terminals 82 are arranged in the first direction Dx with the first terminals 81 interposed between two groups of the second terminals 82. That is, the second terminals 82, the first terminals 81, and the second terminals 82 are arranged in this order in the first direction Dx. Ends in the second direction Dy of the second terminals 82 are coupled to drive circuit coupling wiring 86 through second contact portions CN2. The drive circuit coupling wiring 86 is drawn in the peripheral region GA, and electrically coupled to the scan line drive circuit 15. In the same manner as the locations of formation of the first contact portions CN1 described above, the locations where the second contact portions CN2 are formed are not limited to the ends of the second terminals 82.

For example, the second terminals 82 arranged on the left side of FIG. 8 are electrically coupled to the first scan line drive circuit 15A (refer to FIG. 2), and supply various scan signals and control signals to the first scan line drive circuit 15A. The second terminals 82 arranged on the right side of FIG. 8 are electrically coupled to the second scan line drive circuit 15B (refer to FIG. 2), and supply various scan signals and control signals to the second scan line drive circuit 15B. The second terminals 82 include terminals that are directly or indirectly coupled to the signal lines in the detection region AA to supply thereto the reset potential Vrst and the power supply potential VDD.

The first and the second terminals 81 and 82 are each electrically coupled to a wiring substrate terminal 111 (refer to FIG. 12) of the wiring substrate 110 through an anisotropic conductive film 112 (ACF).

A dummy terminal region 83 is provided between the second terminals 82 adjacent in the first direction Dx. The dummy terminal region 83 is a region provided with no metal layer, and is a region not coupled to the wiring substrate terminal 111 (refer to FIG. 12) of the wiring substrate 110.

The inclination of the first and the second terminals 81 and 82 with respect to the second direction Dy is smaller in the center of the first direction Dx, and increases toward the outer periphery sides in the first direction Dx of the substrate 21. However, the first and the second terminals 81 and 82 are not limited to this arrangement, and may be arranged in parallel. FIG. 8 is merely a schematic illustration, and the number, the shape, the arrangement pitch, and the like of the first and the second terminals 81 and 82 may be changed as appropriate.

In the present embodiment, what is called a film-on-glass (FOG) mounting is used in which the wiring substrate 110 is mounted on the first and the second terminals 81 and 82 using the anisotropic conductive film 112. However, the present embodiment is not limited thereto, and can also be applied to what is called a chip-on-glass (COG) mounting in which an integrated circuit (IC) is mounted on the first and the second terminals 81 and 82.

Figure 9:
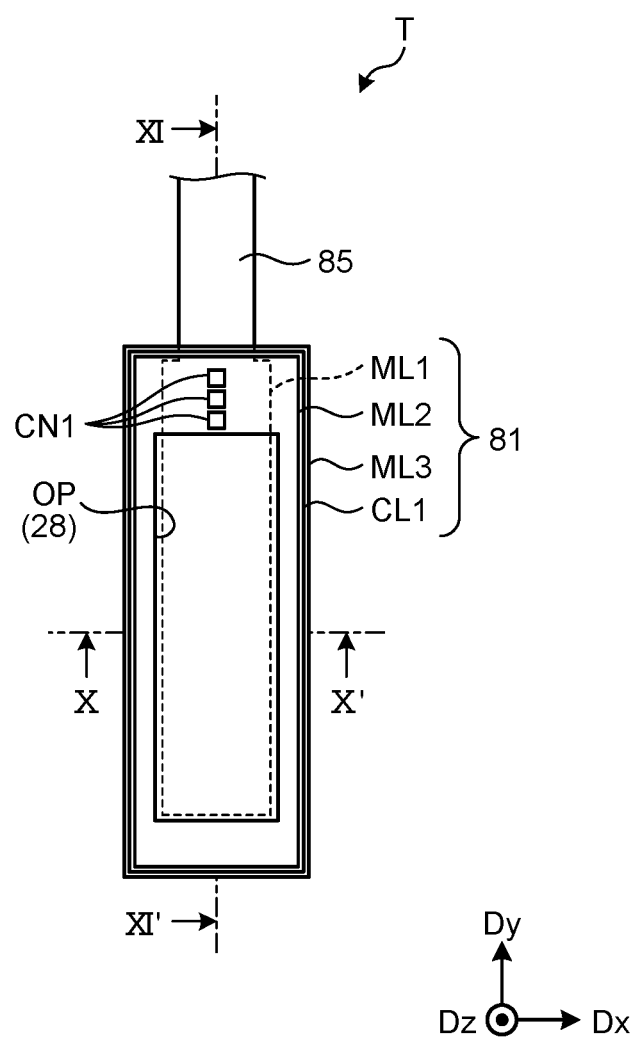
FIG. 9 is a plan view illustrating a magnified view of a first terminal.
Figure 10:
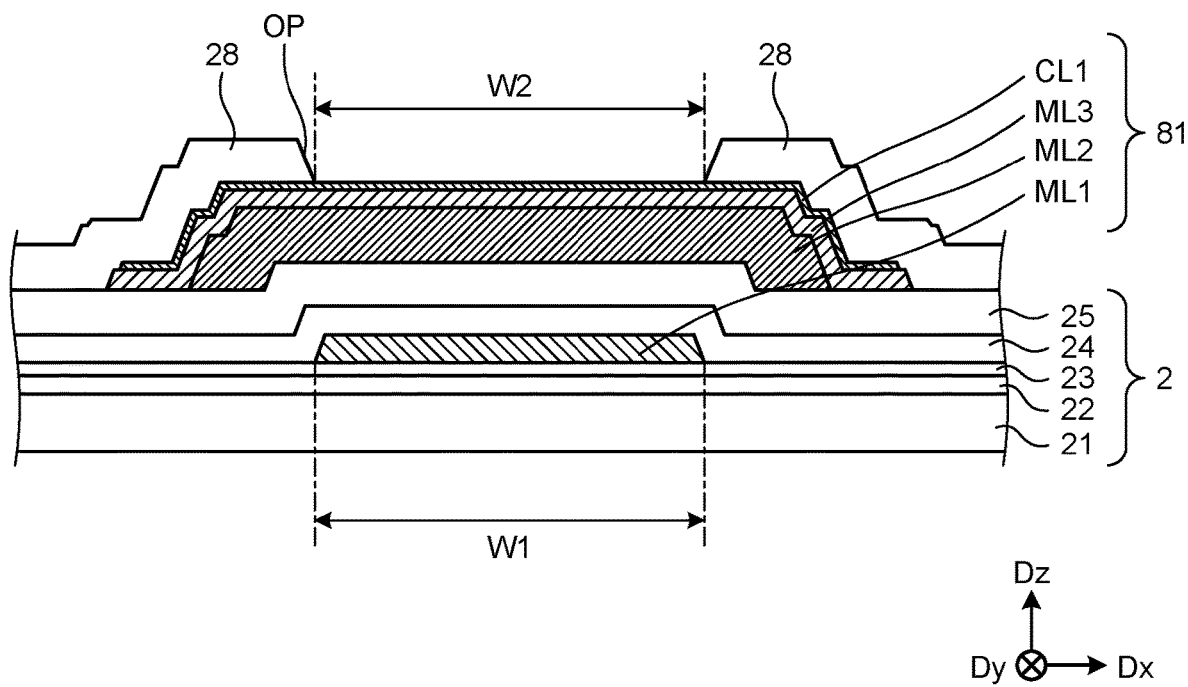
FIG. 10 is a X-X' sectional view of FIG. 9.

The following describes a detailed configuration of the first terminal 81. The following description of the first terminal 81 is also applicable to each of the second terminals 82. FIG. 9 is a plan view illustrating a magnified view of the first terminal. FIG. 10 is a X-X' sectional view of FIG. 9.

As illustrated in FIG. 9, the first terminal 81 includes a first metal layer ML1, a second metal layer ML2, a third metal layer ML3, and a first light-transmitting conductive layer CL1. The first metal layer ML1, the second metal layer ML2, the third metal layer ML3, and the first light-transmitting conductive layer CL1 are rectangular in the plan view, and are provided so as to overlap one another.

The first metal layer ML1 is provided in the same layer as that of the signal line coupling wiring 85, and is coupled to the signal line coupling wiring 85 at an end in the second direction Dy of the first metal layer ML1. The first metal layer ML1 is electrically coupled to the second metal layer ML2 through the first contact portions CN1. The third metal layer ML3 and the first light-transmitting conductive layer CL1 are stacked in this order above the second metal layer ML2.

As illustrated in FIG. 10, the undercoat film 22 and the insulating films 23, 24, and 25 of array substrate 2 are continuously formed from the detection region AA to the peripheral region GA in which the first terminal 81 is provided. The first metal layer ML1 is provided above the insulating film 23. That is, the first metal layer ML1 is the same layer as that of the gate electrodes 64 (refer to FIG. 7) and the scan lines (reset control scan line GLrst and read control scan line GLrd) provided in the detection region AA, and is formed of the same material as that of the gate electrodes 64 and the scan lines.

The second metal layer ML2 is stacked above the first metal layer ML1 with the insulating films 24 and 25 (first interlayer insulating film) interposed therebetween. That is, the second metal layer ML2 is the same layer as that of the various signal lines such as the output signal line SL and the reset signal line SLrst (refer to FIG. 7) provided in the detection region AA, and is formed of the same material as that of the various signal lines.

The third metal layer ML3 is stacked above the second metal layer ML2 so as to be in contact therewith. The third metal layer ML3 is the same layer as that of the lower electrode 35 (refer to FIG. 7), and is formed of the same material as that of the lower electrode 35. The insulating film 26 illustrated in FIG. 7 is not provided in a region of the peripheral region GA overlapping at least the terminal portion T, and the third metal layer ML3 directly contacts the top of the second metal layer ML2 without the insulating film 26 interposed therebetween.

The first light-transmitting conductive layer CL1 is stacked above the third metal layer ML3 so as to be in contact therewith. The first light-transmitting conductive layer CL1 is the same layer as that of the overlapping electrode 37 (refer to FIG. 7), and is formed of the same material as that of the overlapping electrode 37, such as ITO.

The insulating film 28 is provided above the insulating film 25 so as to cover the first light-transmitting conductive layer CL1 of the first terminal 81. The insulating film 28 is provided with an opening OP to expose the first light-transmitting conductive layer CL1 in a region overlapping each of the first terminals 81. In other words, the insulating film 28 is provided so as to cover the periphery of the first light-transmitting conductive layer CL1, and the opening OP is formed inside the periphery. The first light-transmitting conductive layer CL1 is provided at least in a region overlapping the opening OP. The insulating film 28 is provided between the first terminals 81 adjacent in the first direction Dx to insulate between the first terminals 81. The first light-transmitting conductive layer CL1 is not limited to being the same layer as that of the overlapping electrode 37 (refer to FIG. 7), and may be the same layer as that of the upper electrode 34. In this case, the insulating film 27 may be provided instead of the insulating film 28.

A width W1 in the first direction Dx of the first metal layer ML1 is equal to a width W2 in the first direction Dx of the opening OP. The width in the first direction Dx of the second metal layer ML2 is larger than each of the widths W1 and W2. The width in the first direction Dx of the third metal layer ML3 is larger than the width in the first direction Dx of the second metal layer ML2. The width in the first direction Dx of the first light-transmitting conductive layer CL1 is smaller than the width in the first direction Dx of the third metal layer ML3.

Figure 11:
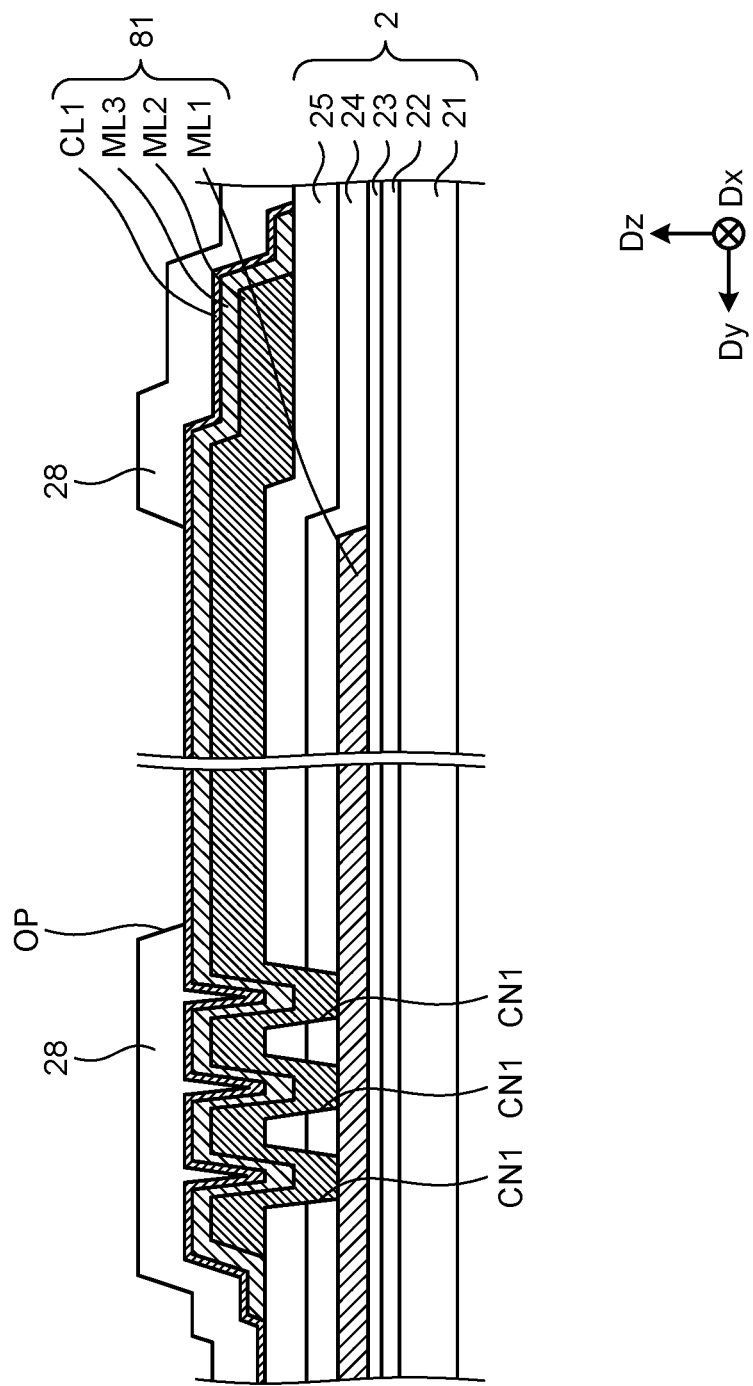
FIG. 11 is an XI-XI' sectional view of FIG. 9.

FIG. 11 is an XI-XI' sectional view of FIG. 9. As illustrated in FIG. 11, the first metal layer ML1 is formed to have a width in the second direction Dy larger than the width in the second direction Dy of the opening OP. The first contact portions CN1 are provided on the second direction Dy side (detection region AA side) of the opening OP, and pass through the insulating films 24 and 25. The first metal layer ML1 is coupled to the second metal layer ML2 through the first contact portions CN1. In FIG. 11, three of the first contact portions CN1 are arranged in the second direction Dy.

Figure 12:
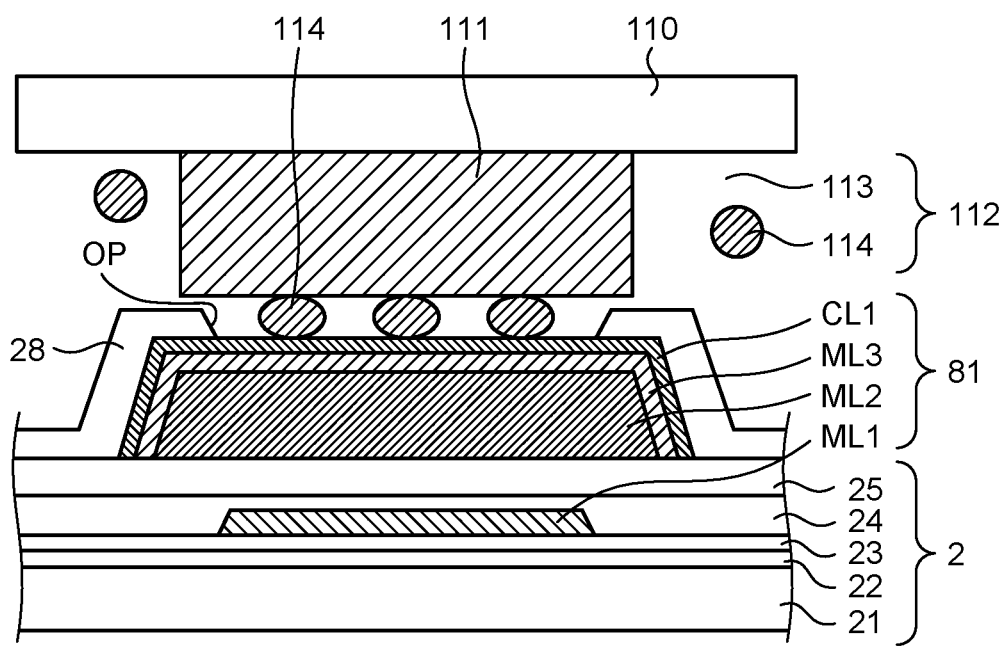
FIG. 12 is a sectional view illustrating a structure example of bonding between the array substrate and a wiring substrate according to the first embodiment.

FIG. 12 is a sectional view illustrating a structure example of bonding between the array substrate and the wiring substrate according to the first embodiment. As illustrated in FIG. 12, the wiring substrate terminal 111 of the wiring substrate 110 faces the first terminal 81 with the anisotropic conductive film 112 interposed therebetween. The anisotropic conductive film 112 includes a resin layer 113 and a number of conductive particles 114 dispersed in the resin layer 113, and is provided above the insulating film 28 so as to cover the first terminal 81. The anisotropic conductive film 112 is in direct contact with a side surface of the insulating film 28 forming the opening OP and with the first light-transmitting conductive layer CL1 overlapping the opening OP. Pressure-bonding the wiring substrate 110 electrically couples the wiring substrate terminal 111 to the first light-transmitting conductive layer CL1 through the conductive particles 114.

Thus, the first, the second, and the third metal layers ML1, ML2, and ML3, and the first light-transmitting conductive layer CL1 of the first terminals 81 are formed of the same layers as the metal layers and the light-transmitting conductive layers that constitute the photodiodes 30 and the transistors in the detection region AA. This configuration allows the first terminals 81 to be formed in the same process as the manufacturing process of the detection region AA. Therefore, the manufacturing process of the detection device 1 can be restrained from expanding, and the manufacturing cost can be reduced.

The first light-transmitting conductive layer CL1 is provided so as to cover the second and the third metal layers ML2 and ML3. The first light-transmitting conductive layer CL1 serves as a protective layer, and can reduce corrosion or the like of the second and the third metal layers ML2 and ML3. An effective coupling region between the wiring substrate 110 and the first terminal 81 is defined by the area of the opening OP provided in the insulating film 28. In the present embodiment, since the insulating film 28 is provided above the first light-transmitting conductive layer CL1, the first light-transmitting conductive layer CL1 can be formed larger with a large contact area ensured between the first light-transmitting conductive layer CL1 and the anisotropic conductive film 112 in the opening OP, while avoiding a short circuit of the first light-transmitting conductive layer CL1 between the adjacent first terminals 81 or between the adjacent second terminals 82. Furthermore, as will be described later, the opening OP can be formed large enough to occupy most of the area of the first metal layer ML1. This configuration can ensure the coupling reliability between the wiring substrate 110 and the first terminal 81.

Since the first metal layer ML1 is provided so as to overlap the opening OP and is formed to have the width W1 same as the width W2, the flatness of the first light-transmitting conductive layer CL1 can be improved in the region overlapping the opening OP. By observing the state of a surface (surface on the substrate 21 side) of the first metal layer ML1, the coupling state between the first terminal 81 and the wiring substrate 110 (pressure-bonding state of the anisotropic conductive film 112) can be checked well.

Figure 13:
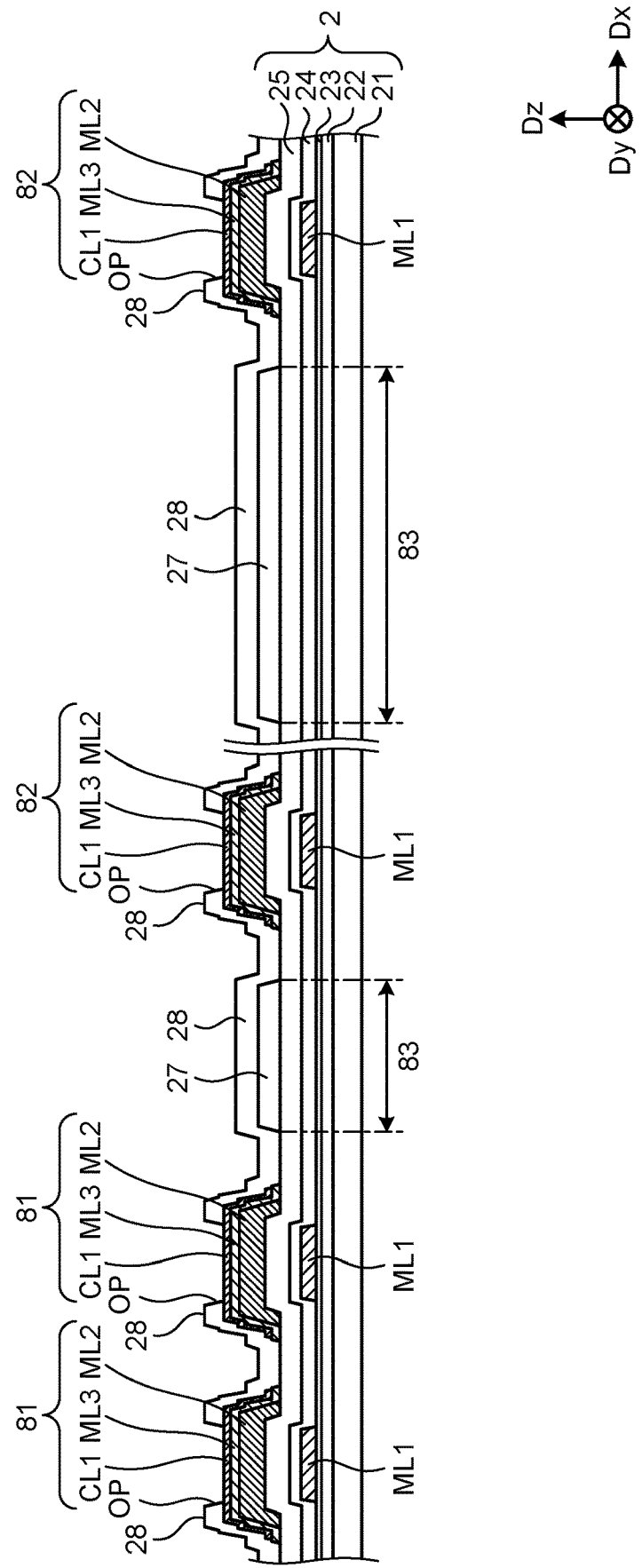
FIG. 13 is a XIII-XIII' sectional view of FIG. 8.

The following describes a configuration of the dummy terminal region 83. FIG. 13 is a XIII-XIII' sectional view of FIG. 8. As illustrated in FIG. 13, the insulating film 27 (second interlayer insulating film) is provided between the insulating films 24 and 25 (first interlayer insulating film) and the insulating film 28 in the dummy terminal regions 83 between the adjacent second terminals 82 and between the adjacent first and second terminals 81 and 82.

This configuration can reduce the difference between the height position of the first light-transmitting conductive layers CL1 of the first and the second terminals 81 and 82 and the height position of the insulating film 28 in the dummy terminal region 83 as compared with a case where the insulating film 27 is not provided. As a result, when the wiring substrate 110 is mounted, the difference between the force applied to the first and the second terminals 81 and 82 and the force applied to the dummy terminal region 83 can be reduced to improve the stability of the mounting. When compared with a case where a metal layer is provided instead of the insulating film 27 (second interlayer insulating film) as a height adjusting structure for the dummy terminal region 83, an unintended electric field can be restrained from being generated between the metal layer of the dummy terminal region 83 and each of the metal layers of the second terminal 82. As a result, a possible occurrence of electric field corrosion of the second terminal 82 under a high-temperature high-humidity environment can be restrained.

The "height position" refers to the distance in the third direction Dz between the first principal surface S1 of the substrate 21 (refer to FIG. 7) and the surface of the first light-transmitting conductive layer CL1 of each of the first and the second terminals 81 and 82. Alternatively, the "height position" refers to the distance in the third direction Dz between the first principal surface S1 of the substrate 21 (refer to FIG. 7) and the surface of the insulating film 28 in the dummy terminal region 83.

In FIG. 13, the width of the dummy terminal region 83 (right side the dummy terminal region 83) between the adjacent second terminals 82 is larger than the width of the dummy terminal region 83 (left side dummy terminal region 83) between the adjacent first and second terminals 81 and 82. The dummy terminal region 83 may be formed to have the width of one of the first terminals 81 (or second terminals 82) or to have a width of two or more of the first terminals 81 (or second terminals 82).

Second Embodiment

Figure 14:
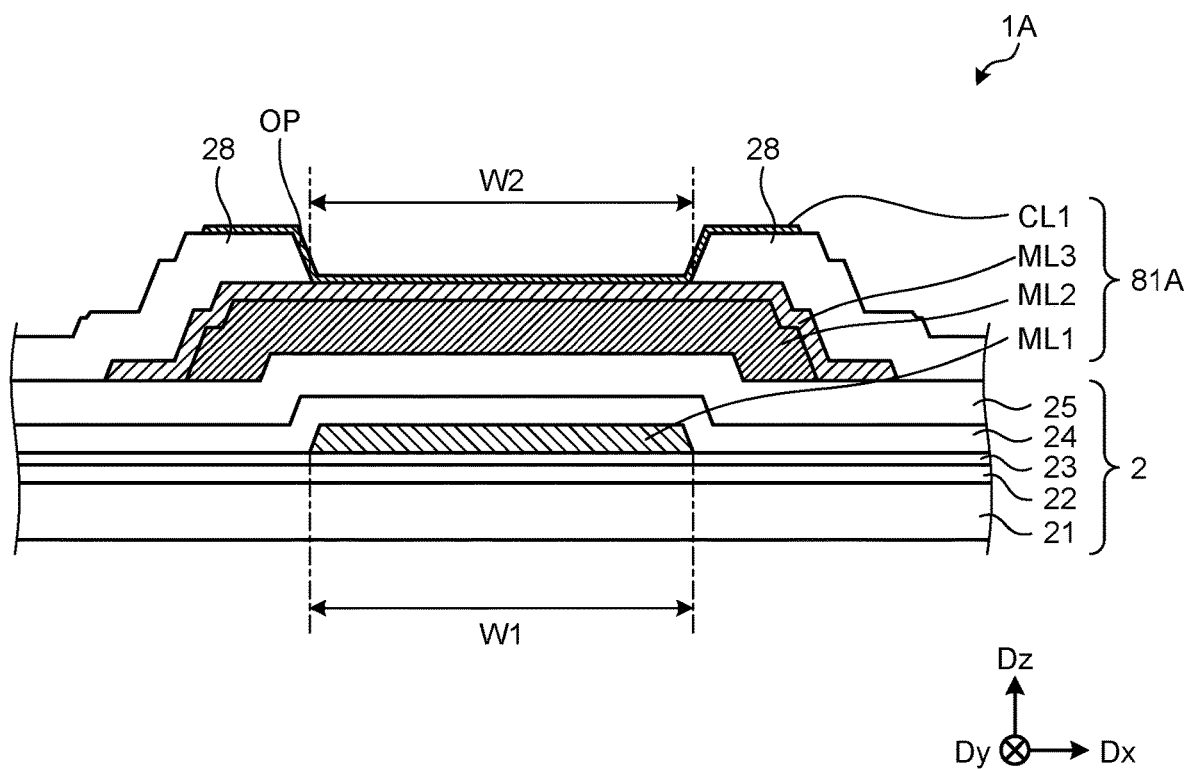
FIG. 14 is a sectional view schematically illustrating a first terminal according to a second embodiment.

FIG. 14 is a sectional view schematically illustrating a first terminal according to a second embodiment. In the following description, the same components as those described in the embodiment described above are denoted by the same reference numerals, and the description thereof will not be repeated.

The following describes a detection device 1A of the second embodiment having a configuration in which the order of stacking the first light-transmitting conductive layer CL1 and the insulating film 28 of a first terminal 81A differs from that of the first embodiment described above. Specifically, as illustrated in FIG. 14, the insulating film 28 is provided above the insulating film 25 so as to cover the third metal layer ML3. The insulating film 28 is provided with the opening OP in a region thereof overlapping the third metal layer ML3.

The first light-transmitting conductive layer CL1 is provided so as to cover the insulating film 28 and the opening OP, and is stacked above the third metal layer ML3 so as to be in contact therewith in a region overlapping the opening OP. The first light-transmitting conductive layer CL1 is provided so as to cover the edge of the insulating film 28 around the opening OP.

In the present embodiment, since the first light-transmitting conductive layer CL1 is provided so as to cover the boundary portion between the insulating film 28 and the third metal layer ML3, water or the like can be restrained from entering the third metal layer ML3 side and the second metal layer ML2 side from the boundary portion. Even in this case, the first light-transmitting conductive layer CL1 provided above the insulating film 28 outside the opening OP is electrically coupled to the conductive particles 114 (refer to FIG. 12). The first light-transmitting conductive layer CL1 provided in a region outside the opening OP can also be used as an auxiliary coupling region, thus being capable of increasing the contact area between the anisotropic conductive film 112 and the first light-transmitting conductive layer CL1. This configuration can restrain increase in coupling resistance between the first terminal 81 and the wiring substrate 110 also in the second embodiment.

Third Embodiment

Figure 15:
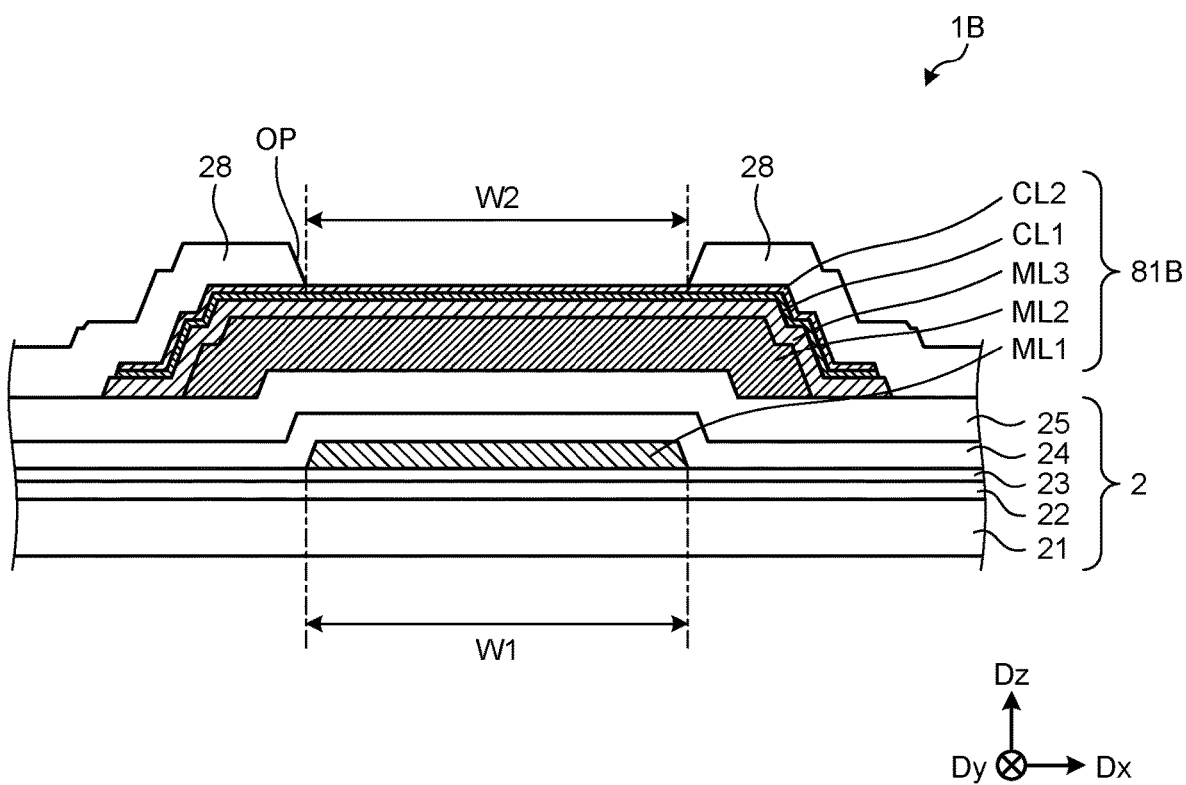
FIG. 15 is a sectional view schematically illustrating a first terminal according to a third embodiment.

FIG. 15 is a sectional view schematically illustrating a first terminal according to a third embodiment. The following describes a detection device 1B of the third embodiment having a configuration in which a first terminal 81B includes a second light-transmitting conductive layer CL2 as compared with the first and the second embodiments described above.

Specifically, as illustrated in FIG. 15, the second light-transmitting conductive layer CL2 is stacked above the first light-transmitting conductive layer CL1 so as to be in contact therewith. The insulating films 28 is provided above the insulating film 25 so as to cover the second light-transmitting conductive layer CL2. The opening OP is provided in a region of the insulating film 28 overlapping the second light-transmitting conductive layer CL2. That is, the first and the second light-transmitting conductive layers CL1 and CL2 are provided at least in a region overlapping the opening OP. The width in the first direction Dx of the second light-transmitting conductive layer CL2 is equal to the width in the first direction Dx of the first light-transmitting conductive layer CL1. The width in the first direction Dx of the first and the second light-transmitting conductive layers CL1 and CL2 is larger than each of the widths W1 and W2. The width of the second light-transmitting conductive layer CL2 is not limited to this width, and may differ from the width of the first light-transmitting conductive layer CL1.

The first light-transmitting conductive layer CL1 is the same layer as that of the upper electrode 34 (refer to FIG. 7), and is formed of the same material as that of the upper electrode 34. The second light-transmitting conductive layer CL2 is the same layer as that of the overlapping electrode 37 (refer to FIG. 7), and is formed of the same material as that of the overlapping electrode 37.

In the present embodiment, since the second light-transmitting conductive layer CL2 is stacked above the first light-transmitting conductive layer CL1, the contact resistance of the first terminal 81B can be reduced from that of each of the first and the second embodiments described above. In the present embodiment, the first and the second light-transmitting conductive layers CL1 and CL2 can protect the second and the third metal layers ML2 and ML3.

The present embodiment can be combined with the second embodiment described above. That is, in FIG. 14, the second light-transmitting conductive layer CL2 may be stacked above the first light-transmitting conductive layer CL1. In other words, the first and the second light-transmitting conductive layers CL1 and CL2 may be provided so as to cover the opening OP and the edge of the insulating film 28 around the opening OP. Alternatively, the first light-transmitting conductive layer CL1, the insulating film 28, and the second light-transmitting conductive layer CL2 may be stacked in this order.

Fourth Embodiment

Figure 16:
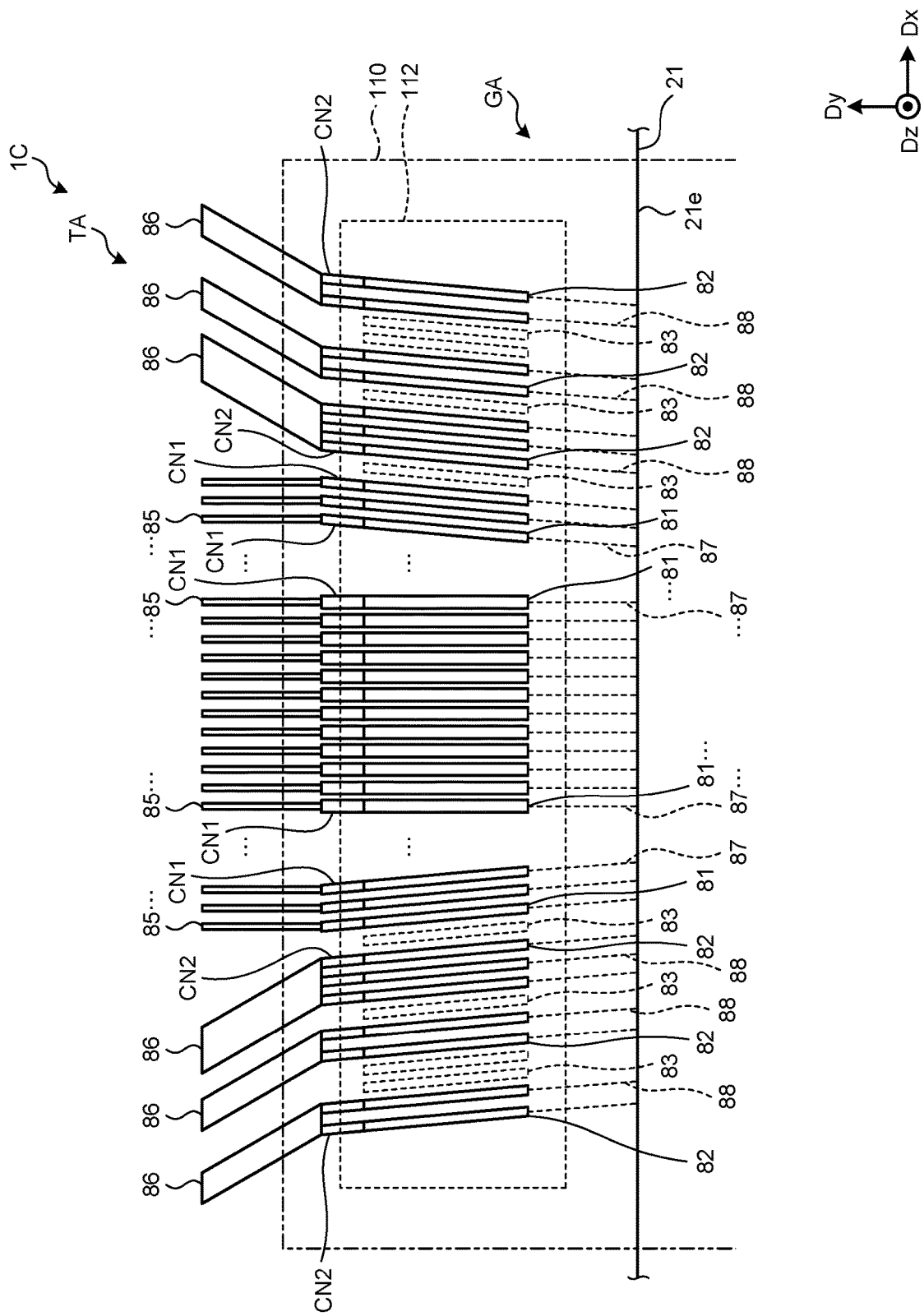
FIG. 16 is a plan view schematically illustrating a configuration of a terminal portion of a detection device according to a fourth embodiment.

FIG. 16 is a plan view schematically illustrating a configuration of a terminal portion of a detection device according to a fourth embodiment. The following describes a detection device 1C of the third embodiment having a configuration in which a terminal portion TA includes outer edge wiring 87 and 88 as compared with the first to the third embodiments describe above.

As illustrated in FIG. 16, the outer edge wiring 87 is electrically coupled to each of the first terminals 81, and extends in the second direction Dy between the first terminals 81 and an outer periphery 21e of the substrate 21. The outer edge wiring 88 is electrically coupled to each of the second terminals 82, and extends in the second direction Dy between the second terminals 82 and the outer periphery 21e of the substrate 21. Ends of the outer edge wiring 87 and 88 overlap the outer periphery 21e of the substrate 21.

Wires of the outer edge wiring 87 and 88 are electrically coupled together in a region outside the outer periphery 21e before the substrate 21 is cut to an external shape, and short-circuit the first and the second terminals 81 and 82. The wires of the outer edge wiring 87 and 88 are what are called short rings provided as a countermeasure for electrostatic discharge (ESD). In the substrate 21 after being cut to the external shape, the ends on the outer periphery 21e side of the outer edge wiring 87 and 88 are coupled to neither the other adjacent wires of the outer edge wiring 87 and 88 nor the other first and second terminals 81 and 82.

In FIG. 16, the outer edge wiring 87 and 88 are coupled to the first and the second terminals 81 and 82, respectively. However, the present embodiment is not limited thereto. The outer edge wiring 88 only needs to be coupled to at least more than one of the second terminals 82, and the outer edge wiring 87 need not be coupled to more than one of the first terminals 81.

Figure 17:
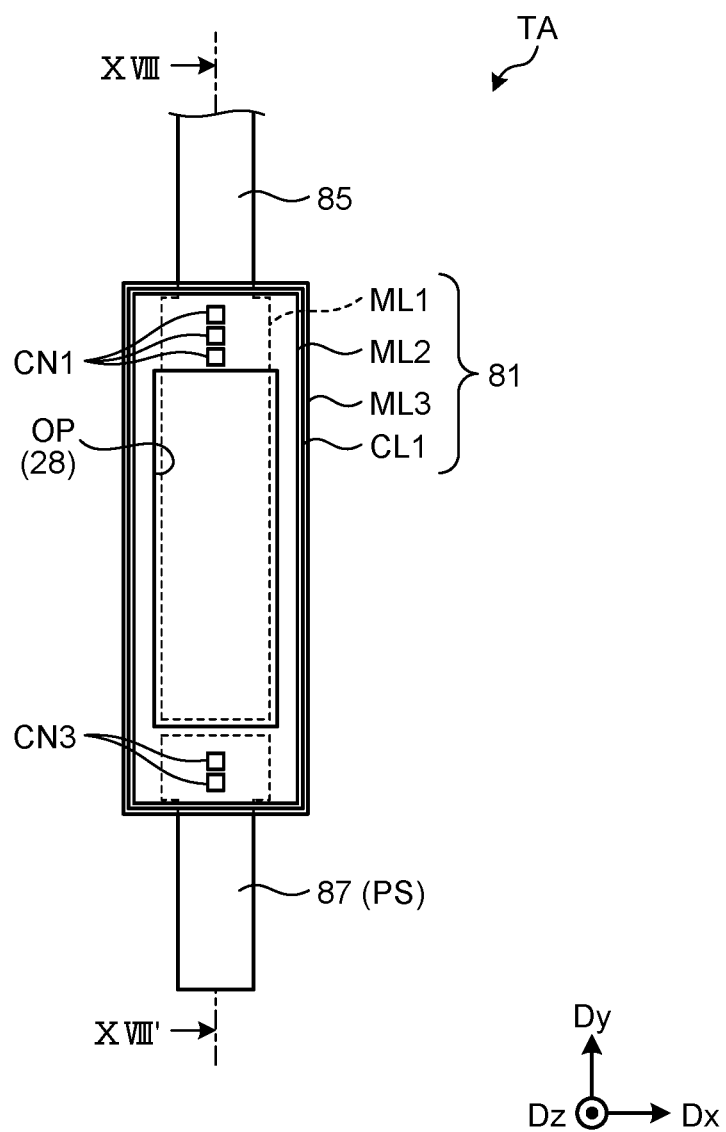
FIG. 17 is a plan view illustrating a magnified view of the first terminal according to the fourth embodiment.
Figure 18:
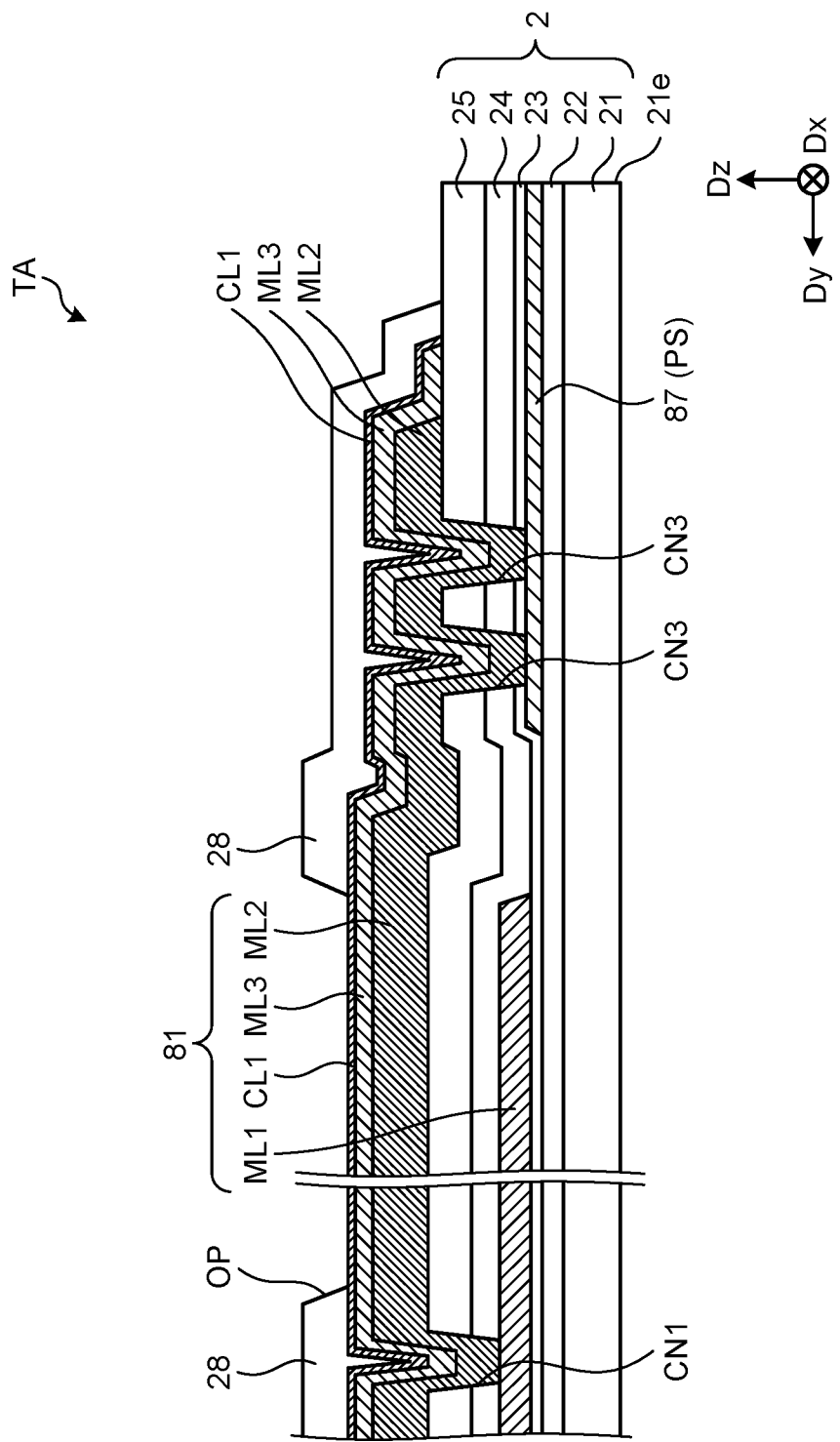
FIG. 18 is an XVIII-XVIII' sectional view of FIG. 17.

FIG. 17 is a plan view illustrating a magnified view of the first terminal according to the fourth embodiment. FIG. 18 is an XVIII-XVIII' sectional view of FIG. 17. The following describes configurations of the first terminal 81 and the outer edge wiring 87 with reference to FIGS. 17 and 18, but the description of the first terminal 81 and the outer edge wiring 87 is also applicable to the second terminal 82 and the outer edge wiring 88.

As illustrated in FIG. 17, the outer edge wiring 87 is arranged adjacent in the second direction Dy to the signal line coupling wiring 85 and the opening OP, and overlaps neither the first metal layer ML1 (signal line coupling wiring 85) nor the opening OP. An end side in the second direction Dy of the outer edge wiring 87 is provided so as to overlap a portion of the second metal layer ML2, and is electrically coupled to the second metal layer ML2 through third contact portions CN3. The outer edge wiring 87 is formed of, for example, a semiconductor layer PS, and is formed of a material different from those of the first to the third metal layers ML1 to ML3 and the first light-transmitting conductive layer CL1. The outer edge wiring 87 is formed of a material having higher resistance than the first to the third metal layers ML1 to ML3.

As illustrated in FIG. 18, the outer edge wiring 87 is provided above the undercoat film 22. That is, the outer edge wiring 87 is the same layer as the first semiconductor layer 61 (refer to FIG. 7), and is formed of the same material as that of the first semiconductor layer 61 (refer to FIG. 7).

The first metal layer ML1 is provided in a region overlapping the opening OP, and is not provided in a region between the opening OP and the outer periphery 21e of the substrate 21 in the second direction Dy. The outer edge wiring 87 is provided in a region between ends in the second direction Dy of the first metal layer ML1 and the opening OP and the outer periphery 21e of the substrate 21.

The second metal layer ML2, the third metal layer ML3, and the first light-transmitting conductive layer CL1 are provided so as to extend from the region overlapping the opening OP to the outer periphery 21e side of the substrate 21. The third contact portions CN3 are provided through the insulating films 23, 24, and 25. The second metal layer ML2 is coupled to the outer edge wiring 87 through the third contact portions CN3

Figure 19:
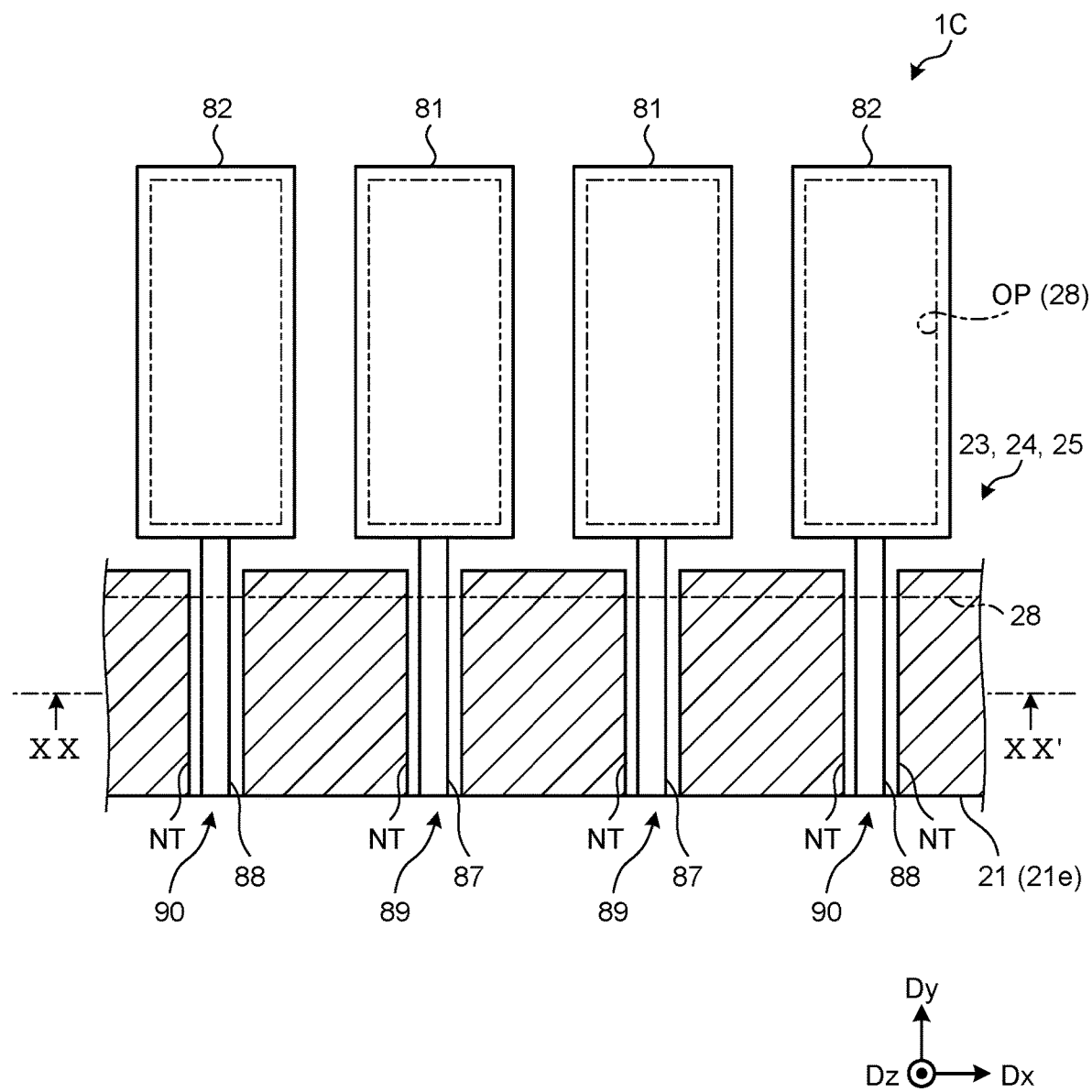
FIG. 19 is an explanatory view for explaining an arrangement relation among the first terminals, a plurality of second terminals, outer edge wiring, and insulating films.
Figure 20:
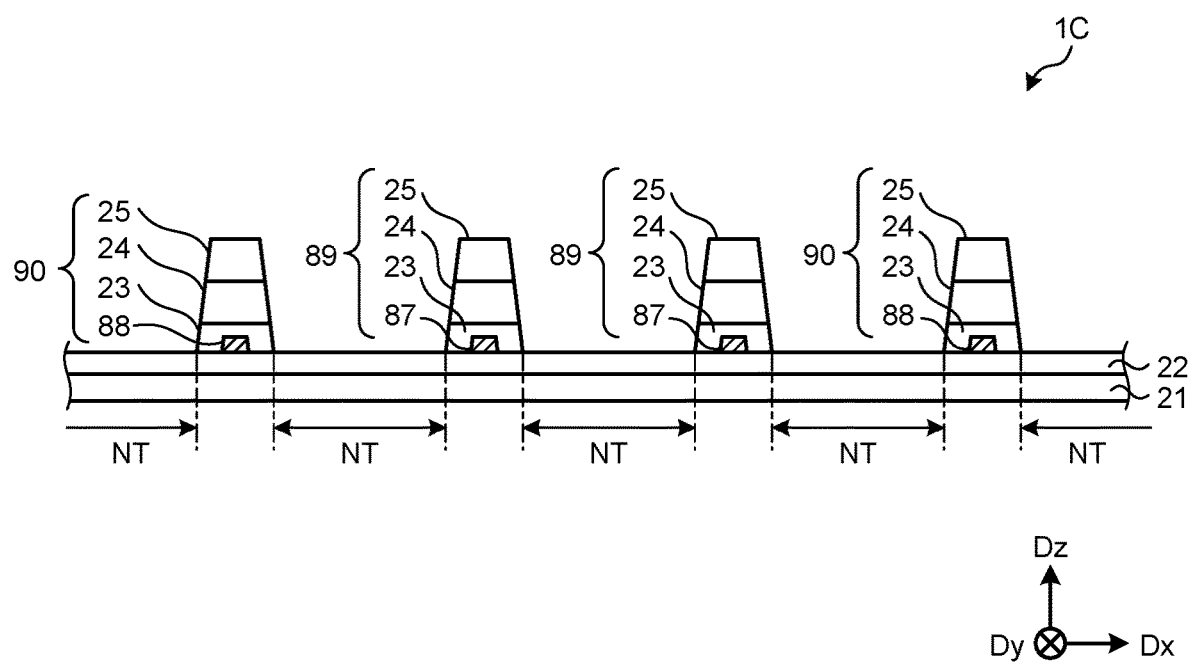
FIG. 20 is a XX-XX' sectional view of FIG. 19.

FIG. 19 is an explanatory view for explaining an arrangement relation among the first terminals, the second terminals, the outer edge wiring, and the insulating films. FIG. 20 is a XX-XX' sectional view of FIG. 19. For ease of viewing the drawings, FIGS. 19 and 20 schematically illustrate the outer edge wiring 87 and 88 coupled to two of the first terminals 81 and two of the second terminals 82.

As illustrated in FIG. 19, the insulating film 23 and the insulating films 24 and 25 (first interlayer insulating film) are provided in regions overlapping the first and the second terminals 81 and 82, and also provided in a region between the first and the second terminals 81 and 82 and the outer periphery 21e of the substrate 21.

In the region between the first and the second terminals 81 and 82 and the outer periphery 21e of the substrate 21, the insulating film 23 and the insulating films 24 and 25 (first interlayer insulating film) extend in the second direction Dy so as to cover each wire of the outer edge wiring 87 and 88. In regions between the wires of the outer edge wiring 87 and 88 adjacent in the first direction Dx, the insulating film 23 and the insulating films 24 and 25 (first interlayer insulating film) are removed to form cutouts NT.

The insulating film 28 is provided so as to cover the first and the second terminals 81 and 82, and also covers portion of the cutouts NT. More specifically, the insulating film 28 is provided so as to cover stepped portions at locations of the cutouts NT closer to the first and the second terminals 81 and 82.

As illustrated in FIG. 20, the outer edge wiring 87 coupled to the first terminals 81 and the insulating film 23 and the insulating films 24 and 25 (first interlayer insulating film) that cover the outer edge wiring 87 are stacked to form a plurality of convex portions 89. The outer edge wiring 88 coupled to the second terminals 82 and the insulating film 23 and the insulating films 24 and 25 (first interlayer insulating film) that cover the outer edge wiring 88 are stacked to form a plurality of convex portions 90. The convex portions 89 and 90 are arranged in the first direction Dx. In the cutouts NT between the adjacent convex portions 89 and 90, the insulating film 23 and the insulating films 24 and 25 (first interlayer insulating film) are not provided, and the undercoat film 22 is located on the surface.

Since the convex portions 89 and 90 are provided, the resin layer 113 (refer to FIG. 12) of the anisotropic conductive film 112 is provided so as to cover the convex portions 89 and 90 when the wiring substrate 110 has been coupled to the first and the second terminals 81 and 82. This configuration increases the contact area between the resin layer 113 of the anisotropic conductive film 112 and the convex portions 89 and 90 in the region between the first and the second terminals 81 and 82 and the outer periphery 21e of the substrate 21 as compared with a configuration in which the insulating film 23 and the insulating films 24 and 25 (first interlayer insulating film) are flatly provided. As a result, in the present embodiment, the strength of coupling of the first and the second terminals 81 and 82 to the wiring substrate 110 can be increased.

Figure 21:
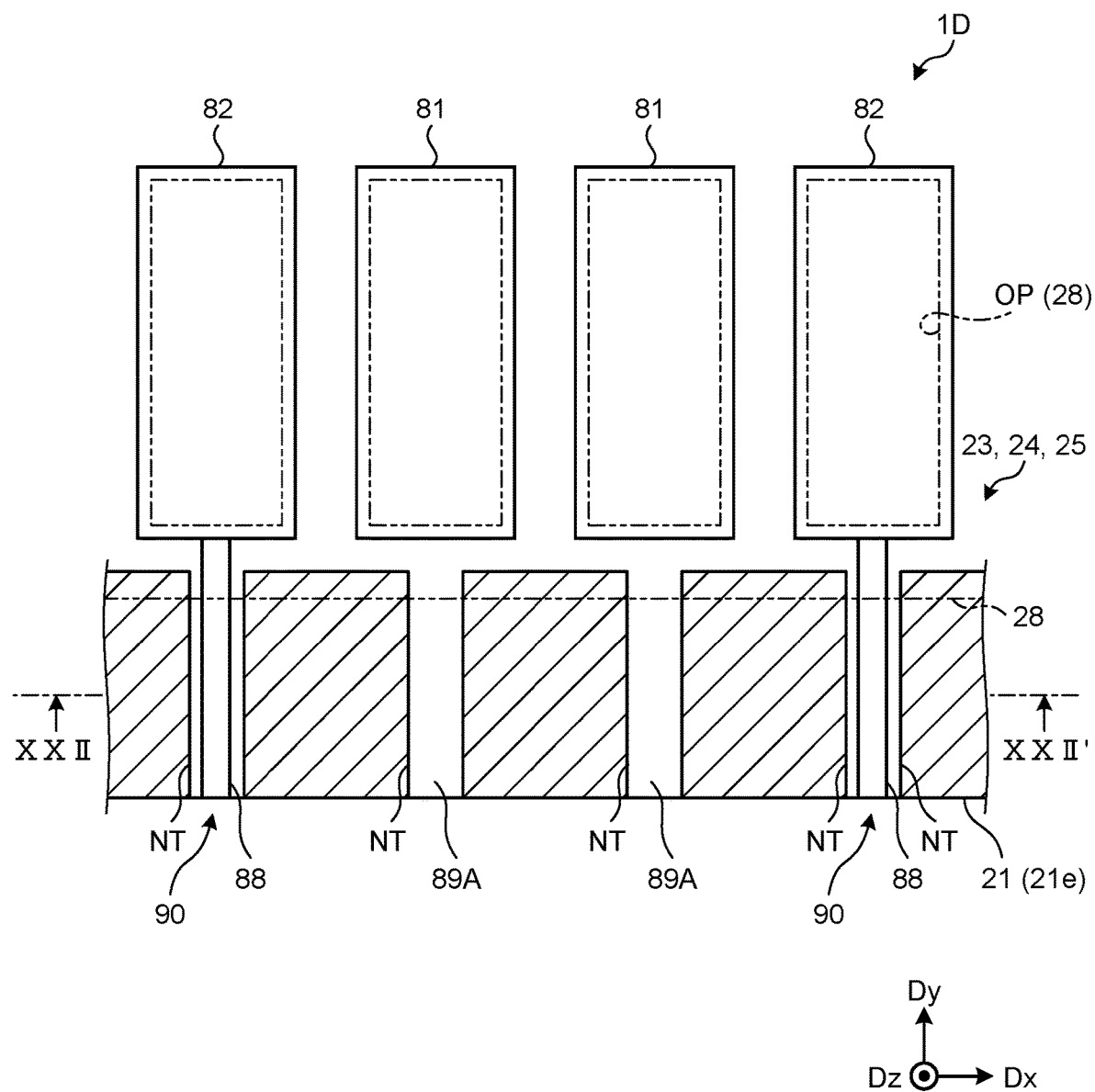
FIG. 21 is an explanatory view for explaining an arrangement relation among the first terminals, the second terminals, the outer edge wiring, and the insulating films according to a fourth modification of the fourth embodiment.
Figure 22:
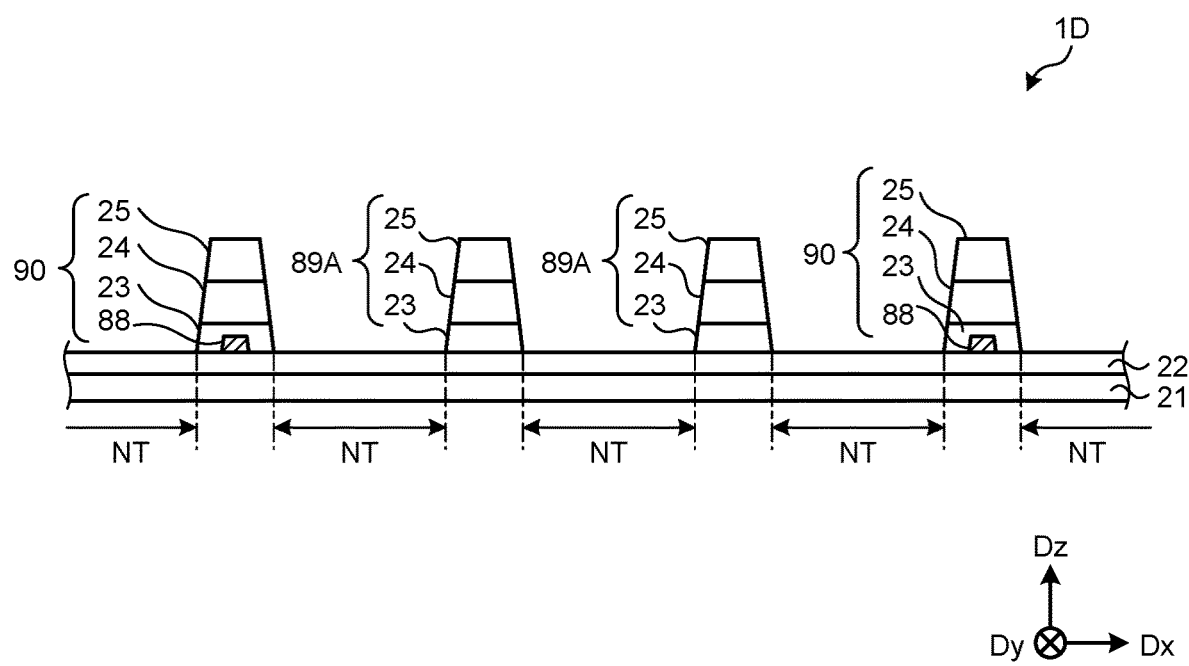
FIG. 22 is a XXII-XXII' sectional view of FIG. 21.

FIG. 21 is an explanatory view for explaining an arrangement relation among the first terminals, the second terminals, the outer edge wiring, and the insulating films according to a fourth modification of the fourth embodiment. FIG. 22 is a XXII-XXII' sectional view of FIG. 21. The following describes a detection device 1D according to the fourth modification of the fourth embodiment having a configuration in which the first terminal 81 is not provided with the outer edge wiring 87.

As illustrated in FIG. 21, the insulating film 23 and the insulating films 24 and 25 (first interlayer insulating film) are provided between the first terminals 81 and the outer periphery 21e of the substrate 21. The insulating film 23 and the insulating films 24 and 25 (first interlayer insulating film) are provided with the cutouts NT in the same manner as in the fourth embodiment described above. As a result, convex portions 89A (first convex portions) are provided in a region between the first terminals 81 and the outer periphery 21e of the substrate 21, and extend in the second direction Dy. The convex portions 90 (second convex portions) are provided in regions between the second terminals 82 and the outer periphery 21e of the substrate 21, and extend in the second direction Dy.

As illustrated in FIG. 22, the convex portions 89A (first convex portions) do not include the outer edge wiring 87, and are formed by stacking the insulating film 23 and the insulating films 24 and 25 (first interlayer insulating film). The convex portions 90 (second convex portions) are formed by stacking the outer edge wiring 88, the insulating film 23 covering the outer edge wiring 88, and the insulating films 24 and 25. The convex portions 89A (first convex portions) and the convex portions 90 (second convex portions) are arranged in the first direction Dx.

In the fourth modification, the convex portions 89A (first convex portions) are provided correspondingly to the respective first terminals 81 even if the outer edge wiring 87 is not coupled to the first terminals 81. As a result, also in the fourth modification, the strength of coupling of the first and the second terminals 81 and 82 to the wiring substrate 110 can be increased in the same manner as in the fourth embodiment in which the outer edge wiring 87 is coupled to the first terminals 81.

Figure 23:
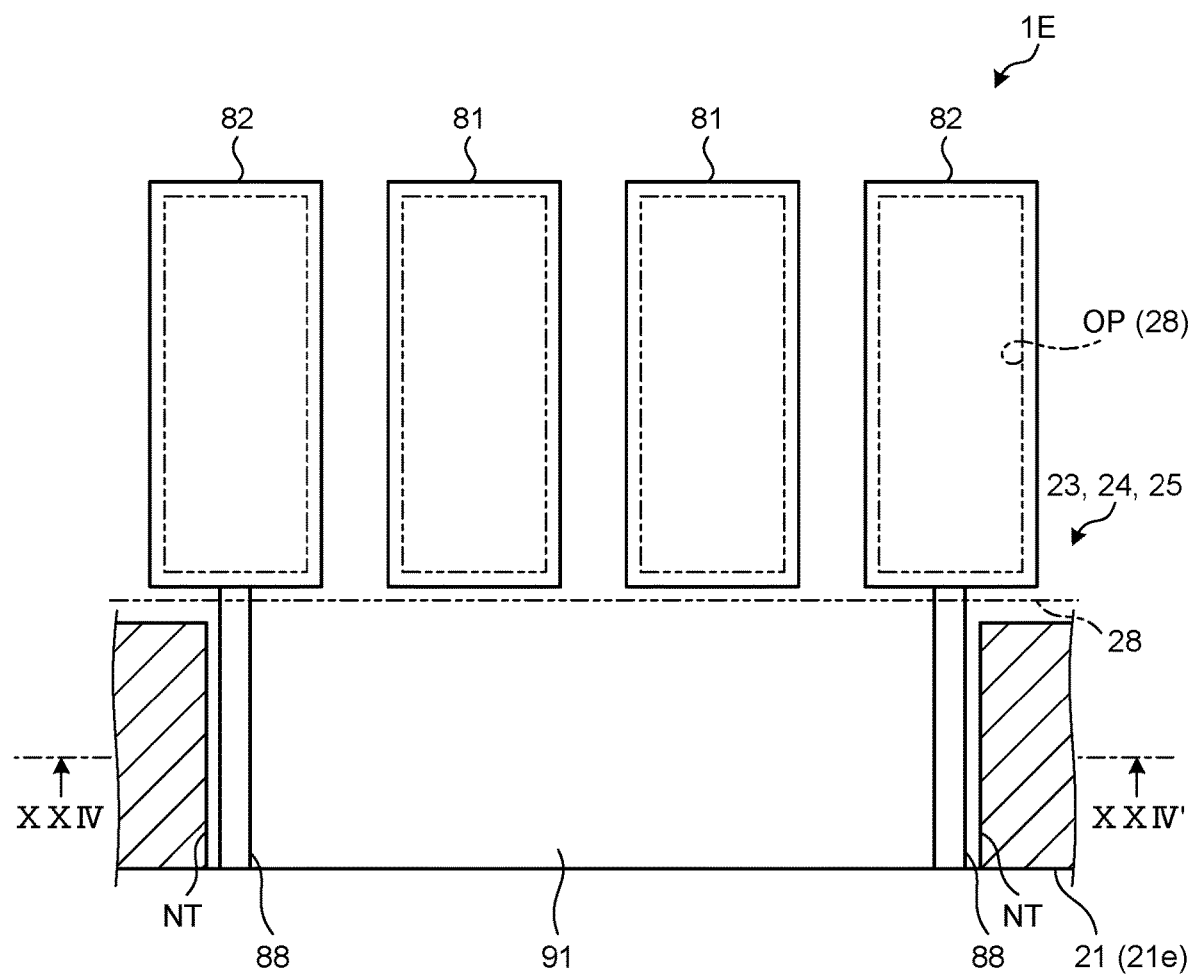
FIG. 23 is an explanatory view for explaining an arrangement relation among the first terminals, the second terminals, the outer edge wiring, and the insulating films according to a fifth modification of the fourth embodiment.
Figure 24:
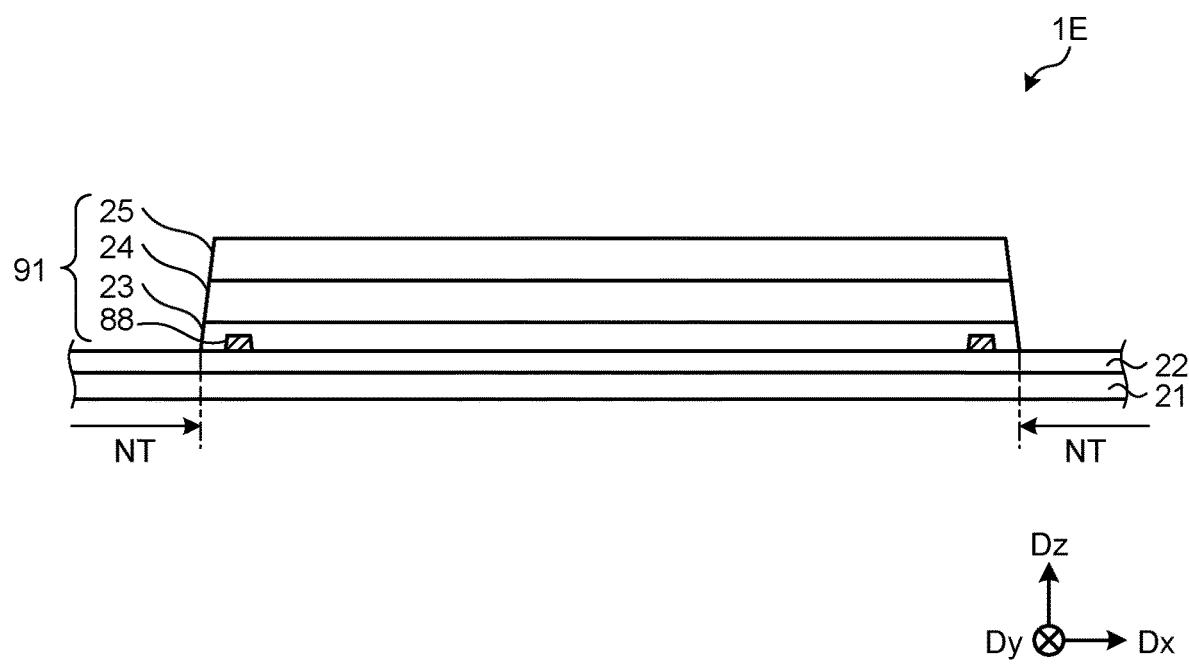
FIG. 24 is a XXIV-XXIV' sectional view of FIG. 23.

FIG. 23 is an explanatory view for explaining an arrangement relation among the first terminals, the second terminals, the outer edge wiring, and the insulating films according to a fifth modification of the fourth embodiment. FIG. 24 is a XXIV-XXIV' sectional view of FIG. 23. The following describes a detection device 1E according to the fifth modification of the fourth embodiment having a configuration in which one continuous convex portion 91 is provided in the region between the first and the second terminals 81 and 82 and the outer periphery 21e of the substrate 21.

As illustrated in FIGS. 23 and 24, the convex portion 91 is formed by stacking a plurality of wires of the outer edge wiring 88, the insulating film 23 covering the wires of the outer edge wiring 88, and the insulating films 24 and 25. The convex portion 91 extends in the first direction Dx adjacent to the first and the second terminals 81 and 82. The insulating film 23 and the insulating films 24 and 25 are provided with the cutouts NT adjacent in the first direction Dx to the convex portion 91.

As illustrated in FIG. 23, the insulating film 28 covers the first and the second terminals 81 and 82, and is provided so as not to overlap the cutouts NT.

In the fifth modification as compared with the fourth embodiment and the fourth modification described above, no cutouts NT are provided between the wires of the outer edge wiring 88. Therefore, insulation between the adjacent wires of the outer edge wiring 88 can be ensured. In the fifth modification, the outer edge wiring 87 is not coupled to the first terminals 81, and the convex portion 91 is provided in the region between the first terminals 81 and the outer periphery 21e of the substrate 21. However, the present modification is not limited to this configuration. The outer edge wiring 87 may be coupled to the first terminals 81. In that case, the one convex portion 91 is provided so as to cover the wires of the outer edge wiring 87 and the wires of the outer edge wiring 88.

The configuration of each of the fourth embodiment and the fourth and the fifth modifications can be combined with any one of the first to the third embodiments described above.

While the preferred embodiments of the present invention have been described above, the present invention is not limited to the embodiments described above. The content disclosed in the embodiments is merely an example, and can be variously modified within the scope not departing from the gist of the present invention. Any modifications appropriately made within the scope not departing from the gist of the present invention also naturally belong to the technical scope of the present invention.

What is claimed is:

1. A detection device comprising:
   a substrate;
   a plurality of photodiodes that are arranged in a detection region of the substrate;
   a plurality of first terminals that are arranged in a first direction in a peripheral region outside the detection region of the substrate;
   an insulating film that covers the first terminals; and
   an anisotropic conductive film that is located above the insulating film, and covers the first terminals, wherein
   each of the first terminals comprises, between the substrate and the insulating film:
      a first metal layer;
      a second metal layer that is stacked above the first metal layer with a first interlayer insulating film interposed between the first metal layer and the second metal layer;
      a third metal layer that is stacked above the second metal layer so as to be in contact with the second metal layer; and
      a first light-transmitting conductive layer that is stacked above the third metal layer so as to be in contact with the third metal layer,
   the insulating film has an opening that exposes the first light-transmitting conductive layer in a region overlapping each of the first terminals, and
   the anisotropic conductive film is in direct contact with a side surface of the insulating film forming the opening and with the first light-transmitting conductive layer overlapping the opening.

2. The detection device according to claim 1, wherein the insulating film is provided so as to cover a periphery of the first light-transmitting conductive layer, and the opening is formed inside the periphery.

3. The detection device according to claim 1, further comprising:
   a plurality of scan lines that are provided in the detection region; and
   a plurality of output signal lines that are provided in the detection region, and intersect the scan lines, wherein
   the first metal layer is the same layer as that of the scan lines, and
   the second metal layer is the same layer as that of the output signal lines.

4. The detection device according to claim 3, further comprising a lower electrode and an upper electrode that are provided in the detection region, wherein the lower electrode, each of the photodiodes, and the upper electrode are stacked in this order, and
the third metal layer is the same layer as that of the lower electrode.

5. The detection device according to claim 4, further comprising an overlapping electrode provided so as to overlap the upper electrode, wherein the first light-transmitting conductive layer is the same layer as that of the upper electrode or the overlapping electrode.

6. The detection device according to claim 4, further comprising, in the detection region, an inorganic insulating film that covers the upper electrode of the photodiode, and a coupling wiring coupled to the upper electrode through a contact hole formed in the inorganic insulating film, wherein
   the inorganic insulating film is formed between the substrate and the insulating film, and
   the first light-transmitting conductive layer is an electrode formed between the insulating film and the inorganic insulating film.

7. The detection device according to claim 5, further comprising a second light-transmitting conductive layer that is stacked on the first light-transmitting conductive layer, wherein
   the first light-transmitting conductive layer is the same layer as that of the upper electrode, and
   the second light-transmitting conductive layer is the same layer as that of the overlapping electrode.

8. The detection device according to claim 1, wherein a width in the first direction of the first metal layer is equal to a width in the first direction of the opening.

9. The detection device according to claim 4, further comprising signal line coupling wiring that is electrically coupled to the output signal lines, and extends in a second direction intersecting the first direction, wherein the first metal layer is provided in the same layer as that of the signal line coupling wiring, is coupled to the signal line coupling wiring, and is electrically coupled to the second metal layer through a first contact portion provided through the first interlayer insulating film.

10. The detection device according to claim 1, further comprising:
    a drive circuit that is provided in the peripheral region; and
    a plurality of second terminals that are provided adjacent in the first direction to the first terminals, and are electrically coupled to the drive circuit.

11. The detection device according to claim 10, further comprising a second interlayer insulating film that is stacked between the first interlayer insulating film and the insulating film in a region between the adjacent second terminals.

12. The detection device according to claim 10, further comprising outer edge wiring that is electrically coupled to each of at least more than one of the second terminals among the first terminals and the second terminals, and extends in a second direction intersecting the first direction between the second terminals and an outer periphery of the substrate.

13. The detection device according to claim 12, wherein
    the first interlayer insulating film extends in the second direction so as to cover the outer edge wiring, and
    a plurality of convex portions in each of which the outer edge wiring and the first interlayer insulating film are stacked are arranged in the first direction.

14. The detection device according to claim 13, wherein the outer edge wiring is not coupled to the first terminals, the detection device comprises:
    a plurality of first convex portions that are provided in a region between the first terminals and the outer periphery of the substrate, and are formed of the first interlayer insulating film; and a plurality of second convex portions that are provided in a region between the second terminals and the outer periphery of the substrate, and in each of which the outer edge wiring and the first interlayer insulating film covering the outer edge wiring are stacked, and the first convex portions and the second convex portions are arranged in the first direction.

* * * * *